(12) United States Patent
Bisberg

(10) Patent No.: US 8,558,255 B2
(45) Date of Patent: Oct. 15, 2013

(54) LED CHIP-BASED LIGHTING PRODUCTS AND METHODS OF BUILDING

(71) Applicant: Albeo Technologies, Inc., Boulder, CO (US)

(72) Inventor: Jeffrey Bisberg, Boulder, CO (US)

(73) Assignee: Albeo Technologies, Inc., Boulder, CO (US)

( * ) Notice: Subject to any disclaimer, the term of this patent is extended or adjusted under 35 U.S.C. 154(b) by 0 days.

(21) Appl. No.: 13/718,755

(22) Filed: Dec. 18, 2012

(65) Prior Publication Data

US 2013/0105829 A1    May 2, 2013

Related U.S. Application Data

(60) Continuation of application No. 13/287,796, filed on Nov. 2, 2011, now Pat. No. 8,338,197, which is a division of application No. 12/857,472, filed on Aug. 16, 2010, now Pat. No. 8,058,659, which is a continuation-in-part of application No. 12/198,662, filed on Aug. 26, 2008, now Pat. No. 7,791,089.

(60) Provisional application No. 61/234,309, filed on Aug. 16, 2009.

(51) Int. Cl.
*H01L 33/00* (2010.01)

(52) U.S. Cl.
USPC .................. 257/88; 257/98; 257/E33.056

(58) Field of Classification Search
USPC .................. 257/88, 98, 99, 100, E33.056
See application file for complete search history.

(56) References Cited

U.S. PATENT DOCUMENTS

| | | |
|---|---|---|
| 4,729,076 A | 3/1988 | Masami et al. |
| 4,814,667 A | 3/1989 | Tanaka |
| 5,082,422 A | 1/1992 | Wang |
| 5,113,232 A | 5/1992 | Itoh et al. |
| 5,119,174 A | 6/1992 | Chen |
| 5,136,483 A | 8/1992 | Schoniger et al. |
| 5,241,360 A | 8/1993 | Key et al. |
| 5,278,432 A | 1/1994 | Ignatius et al. |
| 5,283,425 A | 2/1994 | Imamura |
| 5,534,718 A | 7/1996 | Chang |
| 5,785,418 A | 7/1998 | Hochstein |

(Continued)

OTHER PUBLICATIONS

File history from related U.S. Appl. No. 13/287,796 dated May 17, 2012 through Dec. 5, 2012, 17 pages.

(Continued)

*Primary Examiner* — Hoai V Pham
(74) *Attorney, Agent, or Firm* — Lathrop & Gage LLP

(57) ABSTRACT

A method of building a light-emitting diode (LED) based lighting product includes mounting a plurality of unpackaged LED chips or LEDs directly on conductors on a surface of a two-sided panel, integrating the panel with support structure to form the lighting product such that at least one surface of the panel forms an external surface of the lighting product, and coupling a diffuser, with a distance from the diffuser to the surface of the LED chips or LEDs being at least twice an average spacing between adjacent LED chips or LEDs. A method of building a an LED chip-based lighting product includes mounting unpackaged LED chips directly on conductors formed on a surface of a two-sided panel, and mounting a cover plate to the LED chips such that light emitted from the LED chips passes through the cover plate.

20 Claims, 16 Drawing Sheets

(56) References Cited

U.S. PATENT DOCUMENTS

| | | | |
|---|---|---|---|
| 5,857,767 A | 1/1999 | Hochstein | |
| 6,045,240 A | 4/2000 | Hochstein | |
| 6,354,714 B1 | 3/2002 | Rhodes | |
| 6,561,678 B2 | 5/2003 | Loughrey | |
| 6,568,833 B2 | 5/2003 | Worgan et al. | |
| 6,590,343 B2 | 7/2003 | Pederson | |
| 6,609,804 B2 | 8/2003 | Nolan et al. | |
| 6,894,901 B2 | 5/2005 | Simon | |
| 6,982,518 B2 | 1/2006 | Chou et al. | |
| 6,999,318 B2 | 2/2006 | Newby | |
| 7,023,341 B2 | 4/2006 | Stilp | |
| 7,033,036 B2 | 4/2006 | Pederson | |
| 7,114,831 B2 | 10/2006 | Popovich et al. | |
| 7,170,100 B2 | 1/2007 | Erchak et al. | |
| 7,196,459 B2 | 3/2007 | Morris | |
| 7,201,511 B2 | 4/2007 | Moriyama | |
| 7,236,366 B2 | 6/2007 | Chen | |
| 7,252,408 B2 | 8/2007 | Mazzochette et al. | |
| 7,274,043 B2 | 9/2007 | Erchak et al. | |
| 7,303,315 B2 | 12/2007 | Ouderkirk et al. | |
| 7,309,151 B2 | 12/2007 | Mok et al. | |
| 7,311,423 B2 | 12/2007 | Frecska et al. | |
| 7,344,284 B2 | 3/2008 | Lynam et al. | |
| 7,348,604 B2 | 3/2008 | Matheson | |
| 7,358,929 B2 | 4/2008 | Mueller et al. | |
| 7,476,557 B2 | 1/2009 | Daniels et al. | |
| 7,507,001 B2 | 3/2009 | Kit | |
| 7,549,773 B2 | 6/2009 | Lim | |
| 7,569,420 B2 | 8/2009 | Tung | |
| 7,626,208 B2 | 12/2009 | Yang et al. | |
| 2002/0093832 A1* | 7/2002 | Hamilton | 362/555 |
| 2003/0048641 A1 | 3/2003 | Alexanderson et al. | |
| 2003/0189829 A1 | 10/2003 | Shimizu et al. | |
| 2004/0105264 A1 | 6/2004 | Spero | |
| 2004/0184272 A1 | 9/2004 | Wright et al. | |
| 2004/0264141 A1 | 12/2004 | Spryshak | |
| 2005/0085011 A1 | 4/2005 | Lee | |
| 2005/0099810 A1 | 5/2005 | Tasson et al. | |
| 2005/0157469 A1 | 7/2005 | Gorak | |
| 2005/0243556 A1 | 11/2005 | Lynch | |
| 2005/0287050 A1 | 12/2005 | Rabellino et al. | |
| 2006/0139932 A1 | 6/2006 | Park | |
| 2006/0251259 A1 | 11/2006 | Renkis | |
| 2006/0278808 A1 | 12/2006 | Hick et al. | |
| 2007/0081340 A1 | 4/2007 | Chung | |
| 2007/0115665 A1 | 5/2007 | Mueller et al. | |
| 2007/0121326 A1 | 5/2007 | Nall et al. | |
| 2007/0222369 A1 | 9/2007 | Yoshino et al. | |
| 2007/0230185 A1 | 10/2007 | Shuy | |
| 2007/0247851 A1 | 10/2007 | Villard | |
| 2007/0259160 A1 | 11/2007 | Huang | |
| 2007/0268703 A1 | 11/2007 | Gasquet et al. | |
| 2007/0273290 A1 | 11/2007 | Ashdown et al. | |
| 2007/0291490 A1 | 12/2007 | Tajul et al. | |
| 2008/0007954 A1 | 1/2008 | Li | |
| 2008/0055896 A1 | 3/2008 | Feldmeier | |
| 2008/0137308 A1 | 6/2008 | MacDonald et al. | |
| 2008/0137325 A1 | 6/2008 | Pastore | |
| 2008/0144291 A1 | 6/2008 | Hu | |
| 2008/0158887 A1 | 7/2008 | Zhu | |
| 2008/0170371 A1 | 7/2008 | Lai | |
| 2008/0170380 A1 | 7/2008 | Pastore | |
| 2008/0174969 A1 | 7/2008 | Sandwall | |
| 2008/0186682 A1 | 8/2008 | Sugimura | |
| 2008/0192458 A1 | 8/2008 | Li | |
| 2008/0205054 A1 | 8/2008 | Ho | |
| 2008/0224849 A1 | 9/2008 | Sirhan | |
| 2009/0267085 A1 | 10/2009 | Lee et al. | |
| 2010/0244056 A1 | 9/2010 | Ray et al. | |

OTHER PUBLICATIONS

U.S. Appl. No. 12/198,662, Notice of Allowance mailed Jul. 7, 2010, 8 pages.

Select file history of related U.S. Appl. No. 12/198,662 from Jul. 7, 2010 through Nov. 9, 2010, 23 pages.

Select file for related U.S. Appl. No. 12/857,472, from Mar. 16, 2011 through Oct. 26, 2011, 36 pages.

U.S. Appl. No. 12/843,194 Rule 312 Amendment dated Apr. 6, 2011, 3 pages.

U.S. Appl. No. 12/843,194 Response to Rule 312 Amendment dated Apr. 12, 2011, 2 pages.

U.S. Appl. No. 12/843,194 Notice of Allowance dated Mar. 21, 2011, 10 pages.

U.S. Appl. No. 12/897,593, Response to Office Action filed Mar. 28, 2011, 7 pages.

U.S. Appl. No. 12/897,593, Office Action mailed Feb. 8, 2011, 7 pages.

U.S. Appl. No. 12/897,593, Notice of Allowance mailed Jun. 20, 2011, 12 pages.

U.S. Appl. No. 12/897,593, Supplemental Notice of Allowability mailed Jul. 27, 2011, 6 pages.

* cited by examiner

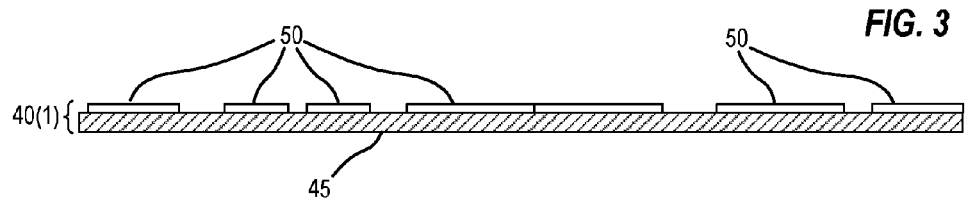
FIG. 3
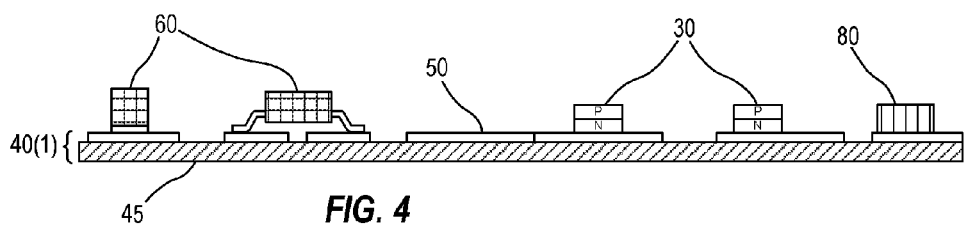
FIG. 4
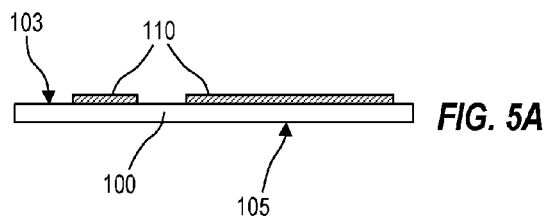
FIG. 5A
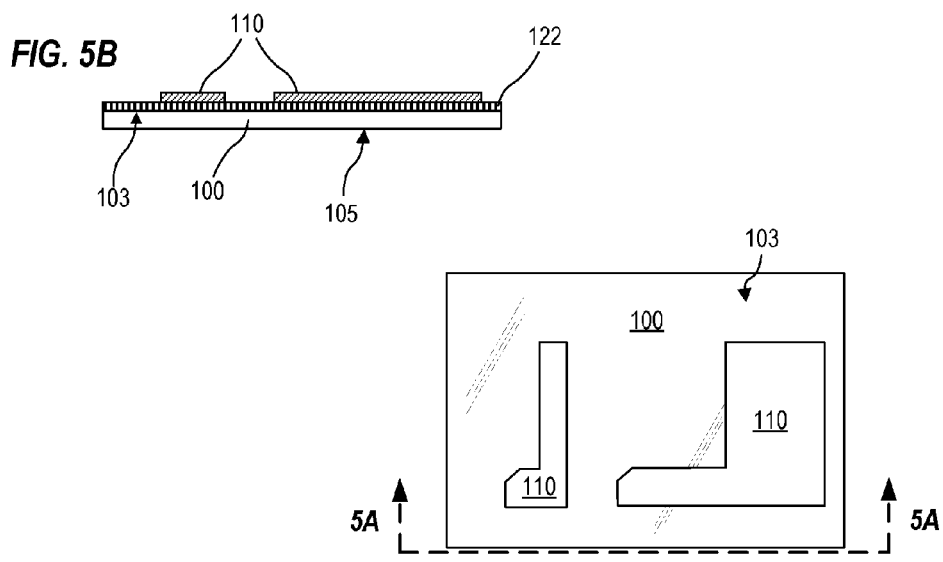
FIG. 5B
FIG. 5C

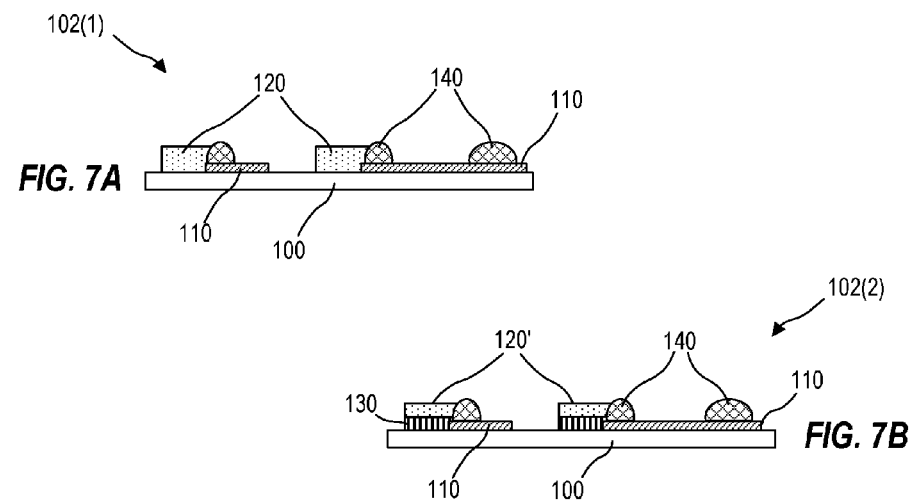
FIG. 7A
FIG. 7B
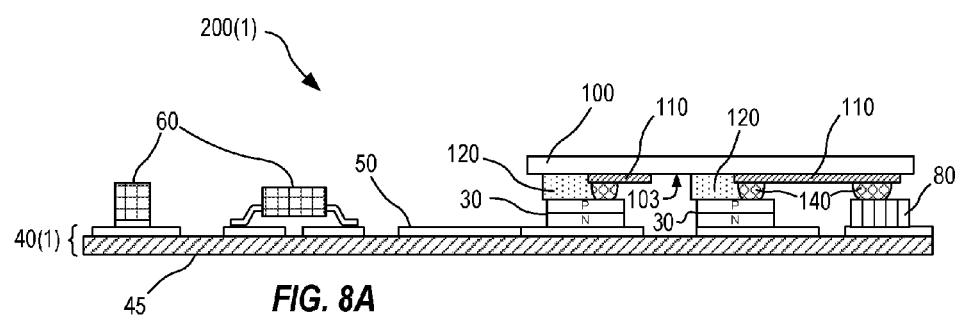
FIG. 8A
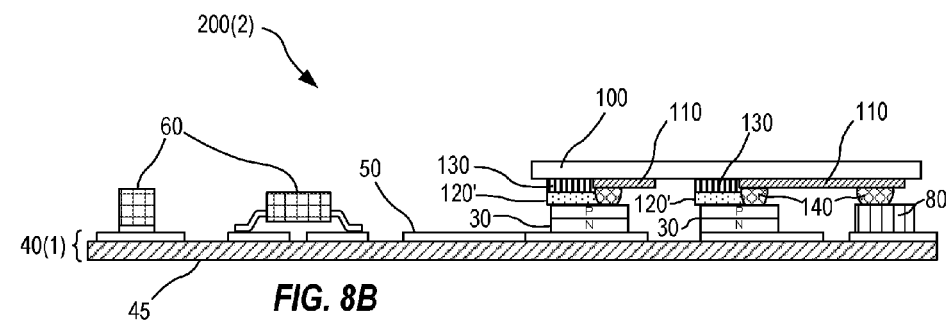
FIG. 8B

US 8,558,255 B2

LED CHIP-BASED LIGHTING PRODUCTS AND METHODS OF BUILDING

CROSS-REFERENCE TO RELATED APPLICATIONS

This application is a continuation application of commonly-owned and U.S. patent application Ser. No. 13/287,796, which is a divisional application of U.S. patent application Ser. No. 12/857,472, now U.S. Pat. No. 8,058,659, filed 16 Aug. 2010. U.S. patent application Ser. No. 12/857,472 claims priority to U.S. Provisional Patent Application Ser. No. 61/234,309, filed 16 Aug. 2009, and is a continuation-in-part of U.S. patent application Ser. No. 12/198,662, now U.S. Pat. No. 7,791,089, filed 26 Aug. 2008. All of the above-identified applications and appendices thereto are incorporated herein by reference in their entireties.

BACKGROUND

Light-emitting diode ("LED") based lighting is increasingly used in both commercial and domestic settings due to its efficiency, flexibility and low toxic material content. Solid-state LEDs are generally manufactured and packaged like other semiconductor products; that is, the LEDs are first fabricated in wafer form, then wafers are diced into individual LED chips that are assembled into individual packages. The packages then mount into products in a variety of ways. In this way, packaging cost is incurred for each individual LED, with this cost accumulating in each product that uses the LEDs.

Net brightness from a single point source is also an issue with LED based lighting. The current trend in solid-state lighting is to employ large LED chips and/or modules of LED chips that have been incorporated onto a printed circuit board (PCB) assembly. Management of manufacturing costs currently favors use of large LED chips (e.g., packaged chips that consume about one watt of electrical power and emit about 80 to 300 lumens of light) because lower numbers of chips and packages are used in a final product. However, users sometimes find the large LED chips uncomfortably bright. Furthermore, placement of large LED chips into a light fixture in an arrayed fashion (such as in lines or rectilinear grids) may result in the fixture projecting a distracting distribution of light. Managing heat transfer away from large LED chips and/or the PCB assemblies may also be problematic.

SUMMARY

In an embodiment, a method of building a light-emitting diode (LED) chip-based lighting product includes patterning conductors on an inside surface of a panel, mounting a plurality of unpackaged LED chips directly on the conductors, and integrating the panel with support structure to form the lighting product such that an outside surface of the panel forms an exterior surface of the lighting product.

In an embodiment, a light-emitting diode (LED) chip-based lighting product includes a panel having an inner surface and an outer surface, the outer surface forming an external surface of the lighting product, conductors patterned on the inner surface, and a plurality of unpackaged LED chips mounted directly to the conductors.

In an embodiment, a light emitting diode (LED)-based lighting product includes a panel having an inner surface and an outer surface, the outer surface forming an external surface of the lighting product, conductors patterned on the inner surface, and a plurality of LEDs mounted directly to the conductors.

BRIEF DESCRIPTION OF DRAWINGS

FIG. 3 illustrates an early stage of fabrication of a PCB, in accord with an embodiment.

FIG. 4 illustrates components mounted to the PCB of FIG. 3, in accord with an embodiment.

FIG. 5A is a side view of a cover plate with conductors, in accord with an embodiment.

FIG. 5B is a side view of the cover plate with conductors of FIG. 5A, and shows a phosphor layer formed on a bottom surface of the cover plate, in accord with an embodiment.

FIG. 5C shows a bottom view of the cover plate of FIG. 5A with the conductors formed as two-dimensional shapes on bottom surface thereof, in accord with an embodiment.

FIG. 7A shows a cover plate subassembly that includes the cover plate with conductors and phosphor gel of FIG. 6A, with a conductive epoxy applied in liquid form to the conductors, in accord with an embodiment. FIG. 7B shows a cover plate subassembly that includes the cover plate with conductors, conformal gel and phosphor layer of FIG. 6B, with a conductive epoxy applied in liquid form to the conductors, in accord with an embodiment.

FIG. 8A shows a PCB assembly formed by mounting the cover plate shown in FIG. 7A, onto the PCB shown in FIG. 4, in accord with an embodiment. FIG. 8B shows a PCB assembly formed by mounting the cover plate shown in FIG. 7B, onto the PCB shown in FIG. 4, in accord with an embodiment.

DETAILED DESCRIPTION OF DRAWINGS

Figure 1:
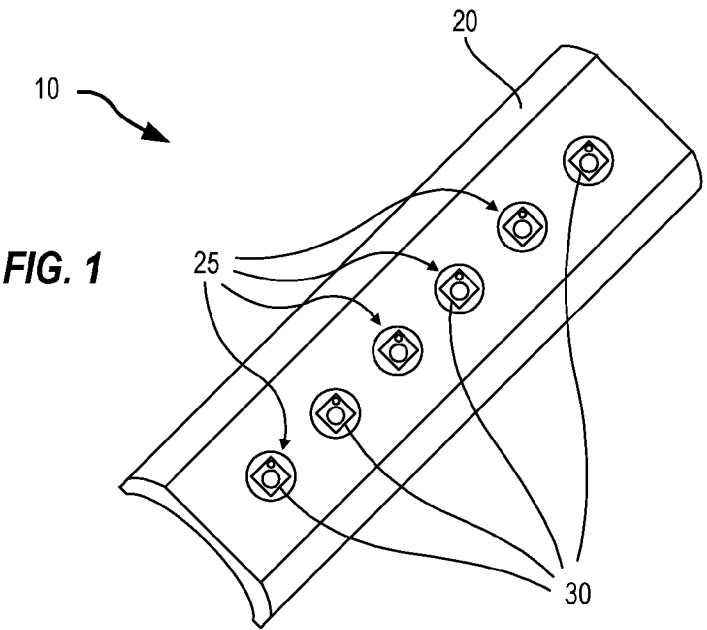
FIG. 1 shows an LED-based lighting product, in accord with an embodiment.

The present disclosure may be understood by reference to the following detailed description taken in conjunction with the drawings described below. It is noted that, for purposes of illustrative clarity, certain elements in the drawings may not be drawn to scale. Specific instances of an item may be referred to by use of a numeral in parentheses (e.g., PCB assemblies 200(1), 200(2)) while numerals without parentheses refer to any such item (e.g., PCB assembly 200). Certain drawings label only representative instances of an element, for illustrative clarity.

FIG. 1 shows an LED-based lighting product 10. Lighting product 10 includes a plurality of LED chips 30 that emit light through apertures 25 of a housing 20. Housing 20 may be a metal rail as shown, but may alternatively be of any desired form or material, and may include translucent or transparent materials for LED chips 30 to emit light through, in which case housing 20 need not include apertures 25.

Figure 2:
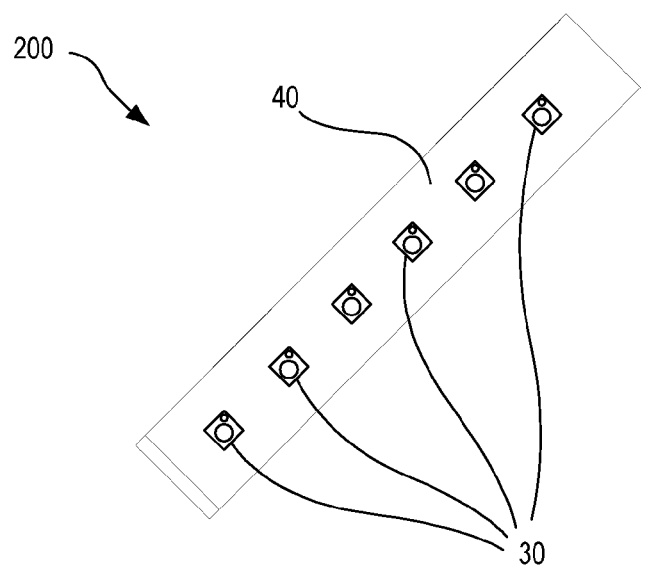
FIG. 2 shows a printed circuit board ("PCB") assembly with LED chips assembled thereon, in accord with an embodiment.

FIG. 2 shows a printed circuit board ("PCB") assembly 200 with LED chips 30 assembled thereon. PCB assembly 200 includes a PCB 40 to which LED chips 30 mount. PCB assembly 200 is an example of a PCB assembly that may be utilized within LED-based lighting product 10.

FIG. 3 illustrates an early stage of fabrication of a PCB 40(1). PCB 40(1) includes a substrate 45 and conductors 50. Substrate 45 may be of known PCB substrate materials; for example, woven glass impregnated with epoxy (sometimes sold under the trade name "FR4"), cotton paper or matte glass impregnated with epoxy, woven glass impregnated with polyester. Conductors 50 may be metal, and for example may be thick copper traces that support thermal transfer in addition to electrical connectivity. Conductors 50 are formed on substrate 45 using known methods of PCB fabrication. Other features may also be formed on substrate 45, for example fiducial marks may be formed for later use in aligning LED chips 30, or cover plate subassemblies (see for example FIG. 6A, FIG. 6B, FIG. 9B, FIG. 11B, FIG. 12C and FIG. 14C) with PCB 40(1).

FIG. 4 illustrates components mounted to PCB 40(1), including circuit components 60, LED chips 30 and a standoff 80 that provides electrical and/or mechanical support for a cover plate or cover plate subassembly, as will be further illustrated below. Circuit components 60, LED chips 30 and standoff 80 may be soldered, or mounted with conductive epoxy, to conductors 50 (not all conductors 50 are labeled in FIG. 4, for clarity of illustration). Circuit components 60 may, for example, regulate power supplied to LED chips 30. When conductive epoxy is utilized, the epoxy may be hardened by a thermal bake or by using ultraviolet ("UV") light.

FIG. 4 and other drawings herein schematically show LED chips 30 as having an N region at a "bottom" side of each chip and a P region at a "top" side of each chip, and the assembly sequence shown in FIG. 3 through FIG. 8B utilize one "backside" electrical contact and one "frontside" electrical contact. However, the P and N regions may be reversed from the order illustrated, and an LED chip 30 may have both P and N contacts on a top surface and that both such contacts may couple with conductors of a cover plate subassembly using the methods discussed below (in connection with FIG. 12A through FIG. 12C, for example). Furthermore, as utilized in the present disclosure the "top" side or "frontside" of an LED chip shall mean the side from which light emits from the chip, and the "bottom" side or "backside" shall mean a side opposite the frontside. That is, the backside is a side from which light does not emit or from which any light that leaks through is not used.

FIG. 5A is a side view of conductors 110 on a bottom surface 103 of a cover plate 100 (the terms "bottom surface" and "top surface" are understood as being in reference to a final configuration of cover plate 100 atop PCB 40, as shown in FIGS. 8A and 8B). Cover plate 100 may be formed of quartz, glass, sapphire, plastic, Mylar, polycarbonate, acrylic, polyester, polyethylene and composites thereof, or other material that is transparent to light generated by LED chips 30. A specific material forming cover plate 100 may be chosen to have a coefficient of thermal expansion approximating that of substrate 45, to minimize the possibility of cracking or adhesive failure with environmental stresses such as temperature cycling or vibration. Conductors 110 may be formed of metal or may be formed of conductive but translucent or transparent materials (e.g., indium tin oxide). Conductors 110 may be formed by conventional methods such as masking and etching such that conductors 110 form a two-dimensional pattern on bottom surface 103 (see FIG. 5C). Besides conducting electrical voltages and/or currents, conductors 110 may be utilized for identification (e.g., part numbers, barcodes) or for visual recognition and positioning (e.g., fiducial marks for alignment of cover plate 100 to LED chips or a PCB). Cover plate 100 also has a top surface 105 upon which coatings may be applied, such as for example antireflective coatings to reduce light reflections at an air interface. Either of bottom surface 103 or top surface 105 may also be shaped, by methods known in the art such as molding, embossing, etching, engraving and/or blazing, to form optics such as lenses, gratings, Fresnel lenses and the like, to modify light passing therethrough by means of refraction or diffraction (see, for example, FIG. 12A and FIG. 12C).

FIG. 5B is a side view of cover plate 100, similar to FIG. 5A, but with conductors 110 formed on a phosphor layer 122 that covers bottom surface 103 of cover plate 100. Phosphor layer 122 may fluoresce when illuminated by LED chips 30, thus converting some of the light energy emitted by LED chips 30 into longer wavelengths to produce a better approximation of white light than the light emitted by LED chips 30 themselves. Phosphor layer 122 is shown in FIG. 5B on bottom surface 103, but it is understood that alternatively, phosphor layer 122 may be formed on top surface 105 of cover plate 100.

FIG. 5C shows a bottom view of cover plate 100 with conductors 110 formed as two-dimensional shapes on bottom surface 103 thereof. Broken line 5A-5A shows a line of sight along which the views of FIGS. 5A and 5B are taken.

Figure 6A:
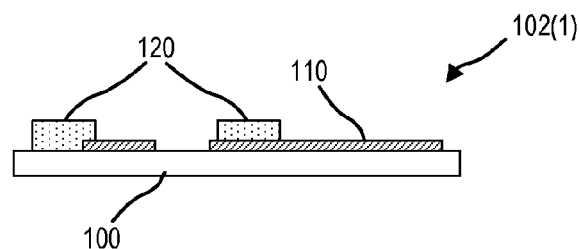
FIG. 6A is a side view of a cover plate subassembly that includes the cover plate of FIG. 5A with two sections of a conformal phosphor gel applied thereto, in accord with an embodiment.

FIG. 6A is a side view of a cover plate subassembly 102(1) that includes cover plate 100 and conductors 110 with two sections of a conformal phosphor gel 120 applied thereto. One or more phosphors, admixed with a gel to form phosphor gel 120, fluoresce under light emitted by LED chips 30, like phosphor layer 122, FIG. 5B, discussed above. Phosphor gel 120 may also be pliable so that, after assembly, it conforms to surface contours of LED chips 30. Portions of phosphor gels 120 are hidden in FIG. 6A behind conductor 110.

Figure 6B:
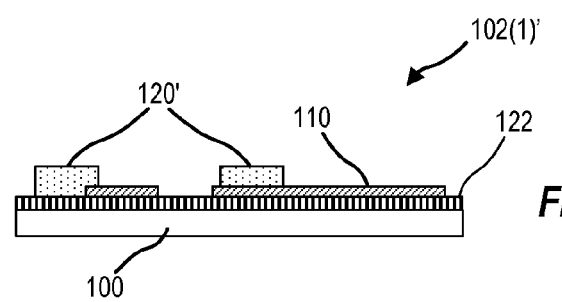
FIG. 6B is a side view of a cover plate subassembly that includes the cover plate of FIG. 5B with two sections of a conformal gel applied thereto, in accord with an embodiment.

FIG. 6B is a side view of a cover plate subassembly 102(1)' that includes cover plate 100 and conductors 110 with phosphor layer 122 (as in FIG. 5B) and two sections of a conformal gel 120' applied thereto. Utilizing phosphor layer 122 with conformal gel sections 120' may promote manufacturing flexibility and reduced cost, since it may not be necessary to remove phosphor layer 122 from areas that do not face LED chips in a final product, but conformal gel sections 120' can be patterned to match an LED layout of a particular product design.

Figure 6C:
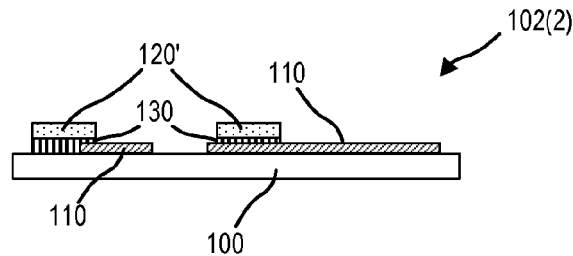
FIG. 6C is a side view of a cover plate subassembly that includes the cover plate of FIG. 5A with two sections of conformal gel and a phosphor layer applied thereto, in accord with an embodiment.

FIG. 6C is a side view of a cover plate subassembly 102(2) having cover plate 100 with two sections of conformal gel 120' and two sections of a phosphor layer 130. Portions of phosphor layers 130 are hidden in FIG. 6C behind conductor 110. It is appreciated that positions of conformal gel 120' and phosphor layer 130 may be reversed from the positions shown in FIG. 6C, such that conformal gel 120' is in contact with cover plate 100. Phosphor gel 120, conformal gel 120' and phosphor layer 130 may be formed on cover plate 100 by known methods such as screen-printing and/or photolithography.

FIG. 7A shows cover plate subassembly 102(1) (as shown in FIG. 6A) with conductive epoxy 140 applied in liquid form to locations on conductors 110 that correspond to circuit connections of LED chips 30 and standoff 80 on PCB 40(1) (as can be seen in FIG. 8A, for example—also see FIGS. 11A through 11C, 12A through 12C and 14A through 14C). FIG. 7B shows cover plate subassembly 102(2) (as shown in FIG. 6B) with conductive epoxy 140 applied in liquid form to conductors 110. As in FIG. 7A, conductive epoxy 140 is applied to locations of conductors 110 that correspond to the location of circuit connections of LED chips 30, and standoff 80, on PCB 40(1). It is understood that alternatively, conductive epoxy 140 may be applied to LED chips 30 and/or standoff 80 on PCB 40(1), in locations that correspond to conductors 110 on cover plate 100.

FIG. 8A shows a PCB assembly 200(1) formed by mounting cover plate subassembly 102(1), as shown in FIG. 7A, onto PCB 40(1), as shown in FIG. 4. Cover plate 100 is inverted relative to the position shown in FIG. 7A, aligned to PCB 40(1) such that conductive epoxy 140 contacts circuit connections of LED chips 30 and standoff 80 on PCB 40(1), and is held in this orientation until conductive epoxy 140 is hardened by using UV light and/or a thermal bake. FIG. 8B shows a PCB assembly 200(2) formed by mounting cover plate subassembly 102(2), as shown in FIG. 7B, onto PCB 40(1), as shown in FIG. 4. Alignment of cover plate 100 to PCB 40(1) and hardening of conductive epoxy 140 are done in similar manner for PCB assembly 200(2) as for assembly 200(1). When cover plate 100 and layers thereon are assembled to PCB 40(1) to form assemblies 200(1) and 200(2), gel 120 or 120' may compress to adjust for a total height between LED chips 30 and cover plate 100 so that LED chips 30 and cover plate 100 are well coupled optically (e.g., through gel 120, gel 120' and/or phosphor layer 130) but only couple mechanically (in a rigid sense) through conductive epoxy 140. That is, gel 120, gel 120' and/or phosphor layer 130 allow for optical coupling but provide a mechanical degree of freedom so that phenomena such as mechanical tolerances, thermal expansion and contraction, and the like, do not exert unwanted force or pressure on LED chips 30.

It is contemplated that embodiments of cover plate subassemblies 102 herein may be utilized for circuitry (e.g., like a PCB) to any extent consistent with the use of the cover plate itself. For example, circuit components may be attached to conductors 110 in addition to, or instead of, such components attaching to PCB 40.

Figure 9A:
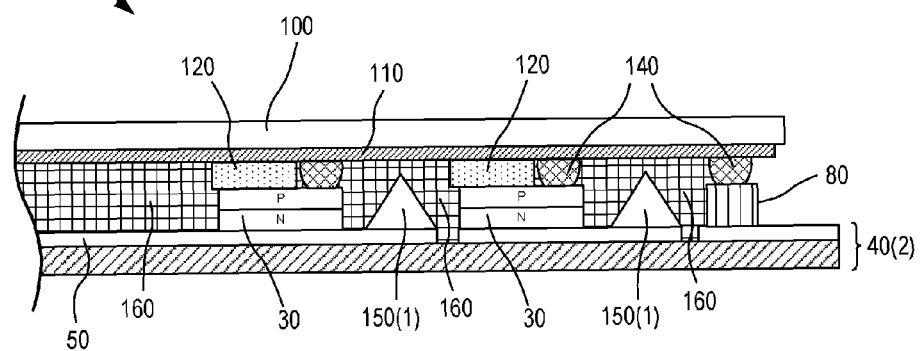
FIG. 9A shows a portion of a PCB assembly with reflectors, in accord with an embodiment.
Figure 9B:
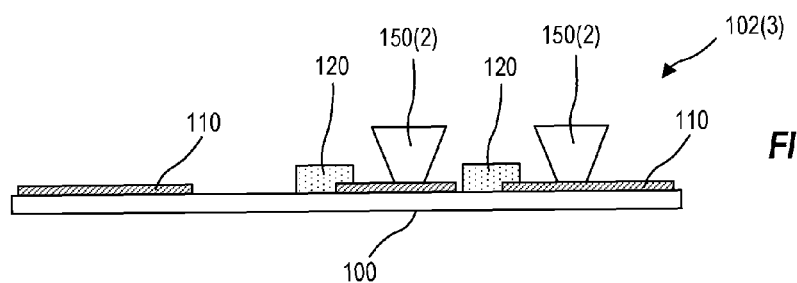
FIG. 9B shows a cover plate subassembly including reflectors, in accord with an embodiment.

Other materials or features may be incorporated into PCB assemblies 200 or components thereof, for enhanced reliability and/or performance. For example, FIG. 9A shows a portion of a PCB assembly 200(3) with reflectors 150(1). Reflectors 150(1) may be formed of metal (e.g., a stamped foil such as aluminum foil), a metal coated plastic (e.g., metalized Mylar) or micromachined silicon, and may mount with conductors 50, as shown, or may mount with cover plate 100, as shown in FIG. 9B. Reflectors 150(1) serve to increase efficiency of PCB assembly 200(3) by reflecting stray light and light emitted from sides of LED chips 30 up through cover plate 100. PCB assembly 200(3) also includes a fill material 160 that fills space between a PCB 40(2) and cover plate 100, except space occupied by components such as LED chips 30, standoff 80, phosphor gel 120 and conductive epoxy 140. Fill material 160 may be a gel, a fluid, epoxy, a UV curable material such as silicone, or a liquid crystal material. Fill material 160 advantageously protects and/or passivates exposed surfaces of LED chips 30 and keeps contaminants out of the space between PCB 40 and cover plate 100. When fill material 160 is liquid crystal material, conductors 50 and 110 may be utilized to activate the liquid crystal material to modulate reflectivity of PCB assembly 200(3). Alternatively, fill material 160 may have a refractive index matched to a refractive index of cover plate 100, thereby eliminating a Fresnel reflection that would otherwise occur at an interface between cover plate 100 and air at bottom surface 103 (e.g., see FIG. 8A).

Figure 9C:
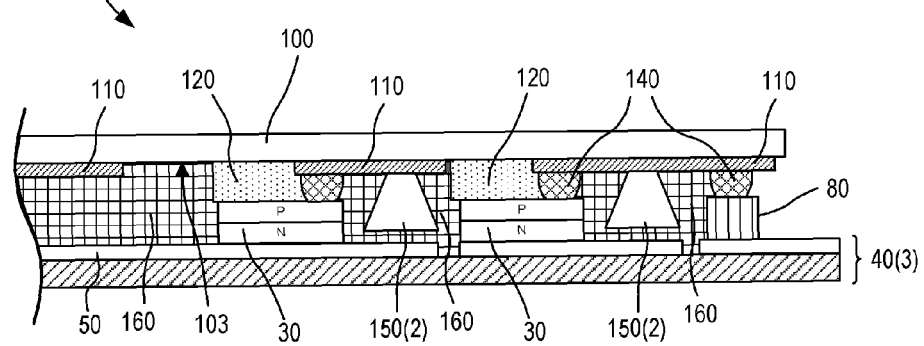
FIG. 9C shows a PCB assembly formed by mounting the cover plate subassembly of FIG. 9B to a PCB with LED chips, and filling the assembly with fill material, in accord with an embodiment.

FIG. 9B shows a cover plate subassembly 102(3) including reflectors 150(2). Like reflectors 150(1) shown in FIG. 9A, reflectors 150(2) may be formed of metal, a metal coated plastic or micromachined silicon. Reflectors 150(2) attach to conductors 110 of cover plate 100 such that when assembled to a PCB with LED chips mounted thereon, reflectors 150(2) are located between the LED chips and increase efficiency by reflecting light through cover plate 100. FIG. 9C shows a portion of a PCB assembly 200(4) formed by mounting cover plate subassembly 102(3) (shown in FIG. 9B) to a PCB 40(3) with LED chips 30, and filling the assembly with fill material 160.

Additionally to the use of reflectors and fill material, LED chips 30 may include features and materials that cooperate with the materials and construction method detailed above. For example, LED chips 30 may include a phosphor coating and/or index matching gel before mounting to a PCB 40; such coatings may be applied in wafer form for reduced cost. LED chips 30 may also be designed to include features such as fiducial marks that facilitate alignment of other structures thereto by humans or by machine vision (see for example FIG. 11A). Also, although FIGS. 4, 8A, 8B, 9A and 9C herein show LED chips 30 as having an N type bottom layer accessed through a backside contact and a P type top layer accessed through a frontside contact, it is appreciated that LED chips may include topside contacts for both P and N layers, as illustrated in FIGS. 12A through 12C and FIGS. 14A through 14C.

Other features that may be incorporated into PCB assemblies with LED chips facilitates alignment among the components thereof. A layout of a PCB assembly 200 may require alignment tolerances among the components thereof, leading to the layout being larger when the alignment tolerances are large. The larger layout may contribute to issues with performance (e.g., transferring heat away from the LED chips, inability to get as many LED chips as desired into a package of a given size) and/or reliability (e.g., larger cover plates and/or PCBs may be more susceptible to cracking or adhesive failure under stress). In particular, features that facilitate self-aligning assembly and/or machine vision for alignment purposes are now described.

Figure 10A:
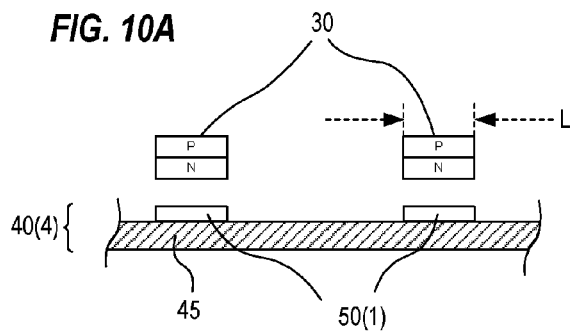
FIGS. 10A through 10C illustrate how solder reflow may be utilized to align LED chips to a PCB, in accord with an embodiment.
Figure 10B:
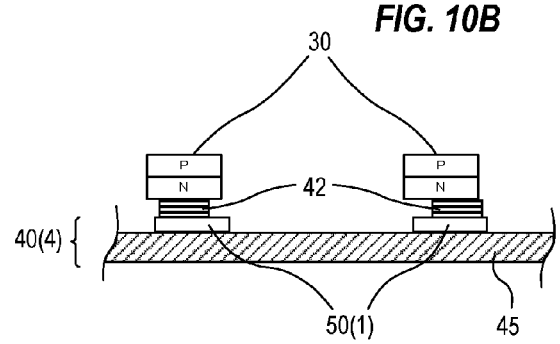
Figure 10C:
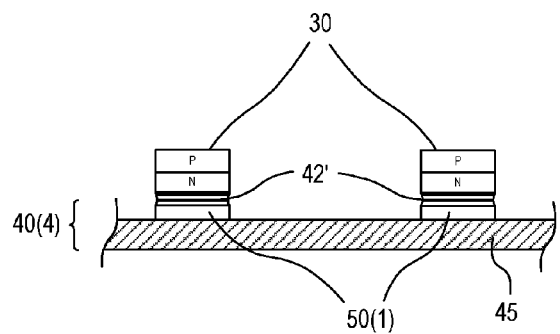

FIGS. 10A through 10C illustrate how solder reflow may be utilized to align LED chips to a PCB. FIG. 10A shows a portion of a PCB 40(4) that includes a substrate 45, and conductors 50(1) sized for coupling of LED chips 30 through self-aligning solder reflow. Solder may be supplied in the form of a slug that approximately matches the outline of conductors 50(1) where attachment of LED chips 30 is desired. FIG. 10B shows LED chips 30 and solder 42 placed onto conductors 50(1) with imperfect alignment; note that edges of LED chips 30 and solder 42 do not align vertically with edges of conductors 50(1). Solder 42 is then heated to a melting point of solder 42, which melts to form a liquid 42' having surface tension, as shown in FIG. 10C. The surface tension is minimized by reducing area about edges of LED chips 30 and conductors 50(1), pulling LED chips 30 into alignment with conductors 50(1). When liquid solder 42' cools and hardens into solid form, LED chips 30 remain aligned and couple with conductors 50(1). The term "solder" herein is not limited to lead-tin solder but encompasses all equivalent types of low melting point metals that may include, for example, lead, tin, copper, silver, bismuth, indium, zinc and antimony.

The approach illustrated in FIGS. 10A through 10C is particularly effective for smaller LED chips (e.g., LED chips with length and/or width less than 250 microns), as an aligning force generated in a given direction at the edges of liquid solder 42' is proportional to a peripheral length of each LED chip 30 transverse to that direction, while a mass of each LED chip 30 is proportional to an area of the chip. Therefore, for a square LED chip 30 having sides of length L (as shown in FIG. 10A) a ratio of the aligning force to the mass of a single LED chip 30 varies as $2L/L^2$. This ratio is larger for a smaller L, so a smaller LED chip is subject to a higher aligning force in proportion to its mass. It is also appreciated that alternatively, (1) solder 42 may be plated, or formed by deposition and etching, onto traces 50(1) where attachment of LED chips 30 is desired, and/or (2) conductors 50 may extend beyond a desired bonding area for LED chips 30, with a soldermask layer forming an opening at the desired bonding area.

Figure 11A:
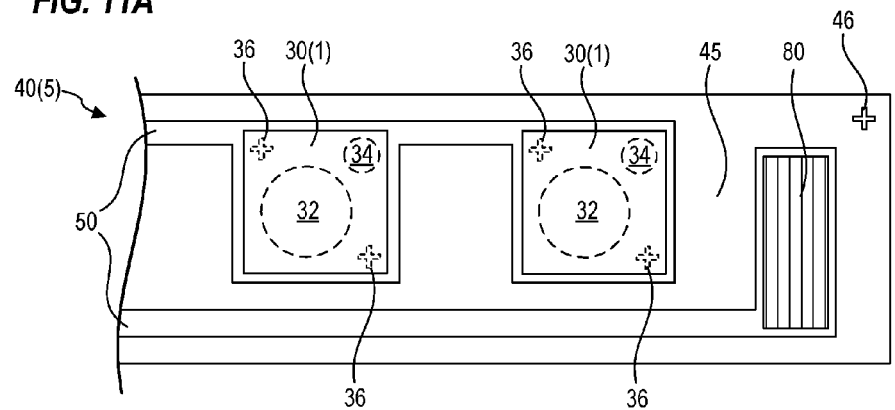
FIG. 11A is a plan view of a portion of a PCB with two LED chips and a standoff mounted thereon, for subsequent coupling with cover plate subassembly to form a PCB assembly, in accord with an embodiment.

FIG. 11A is a plan view of a portion of a PCB 40(5) with two LED chips 30(1) and standoff 80 mounted thereon, for subsequent coupling with cover plate subassembly 102(4) (see FIG. 11B) to form a PCB assembly. PCB 40(5) includes substrate 45, conductors 50 and a fiducial mark 46, as shown. LED chips 30(1) and standoff 80 couple with conductors 50 using solder and/or conductive epoxy. Although conductors 50 are shown as slightly overlapping LED chips 30(1) and standoff 80, this is for illustrative clarity and it is appreciated that conductors 50 may be laid out coincidentally with LED chips 30(1) and/or standoff 80 for purposes of self-aligning solder reflow, as discussed above in connection with FIGS. 10A through 10C. Each LED chip 30(1) is shown as having a light emitting area 32, a frontside contact 34 and fiducial marks 36 in dashed outline; it is appreciated that shape, size and position of light emitting area 32, a frontside contact 34 and fiducial marks 36 are matters of LED chip layout and may vary from the shapes shown.

Figure 11B:
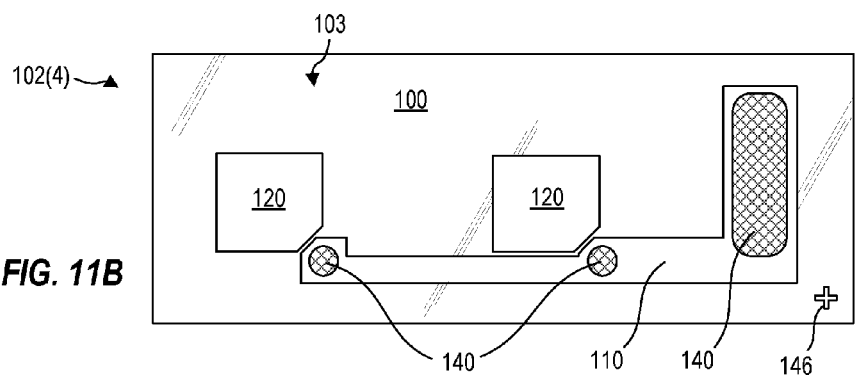
FIG. 11B is a plan view of a cover plate subassembly ready for coupling with the PCB of FIG. 11A to form a PCB assembly, in accord with an embodiment.

FIG. 11B is a plan view of a cover plate subassembly 102(4) ready for coupling with PCB 40(5) to form a PCB assembly. FIG. 11B shows bottom surface 103 of cover plate subassembly 102(4) such that subassembly 102(4) would be turned over top-to-bottom to couple with PCB 40(5). Cover plate subassembly 102(4) includes cover plate 100 having a conductor 110, phosphor gels 120 and a fiducial mark 146. Conductive epoxy 140 is shown as being placed on conductor 110 such that epoxy 140 will face frontside contacts 34 and standoff 80 when subassembly 102(4) couples with PCB 40(5).

Figure 11C:
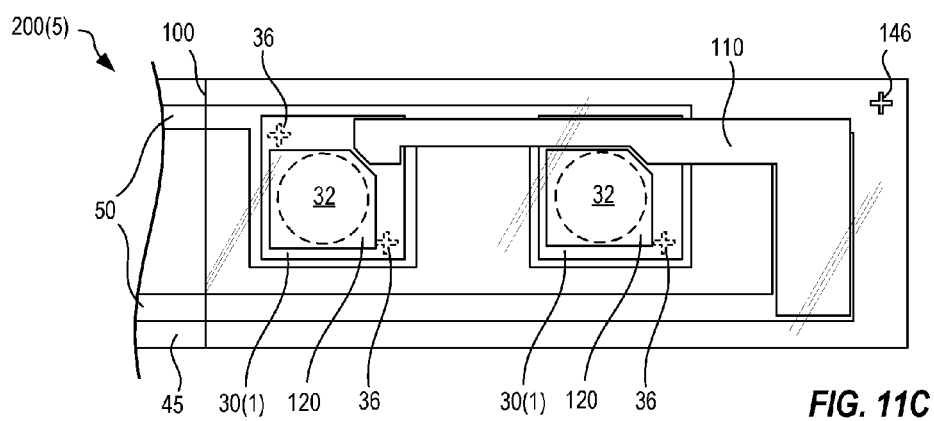
FIG. 11C shows the cover plate subassembly of FIG. 11B coupled with the PCB of FIG. 11A, to form a PCB assembly, in accord with an embodiment.

FIG. 11C shows cover plate subassembly 102(4), FIG. 11B, coupled with PCB 40(5), FIG. 11A, to form PCB assembly 200(5). Since cover plate 100 is transparent, most elements shown in FIG. 11A and FIG. 11B remain visible, but conductor 110 is opaque, hiding conductive epoxy 140, frontside contacts 34 and one instance of fiducial mark 36 in FIG. 11C. Alignment of cover plate subassembly 102(4) to PCB 40(5) includes aligning fiducial mark 146 (FIG. 11B) to fiducial mark 46 (FIG. 11A) so that fiducial mark 46 is also hidden beneath fiducial mark 146 in FIG. 11C.

Figure 12A:
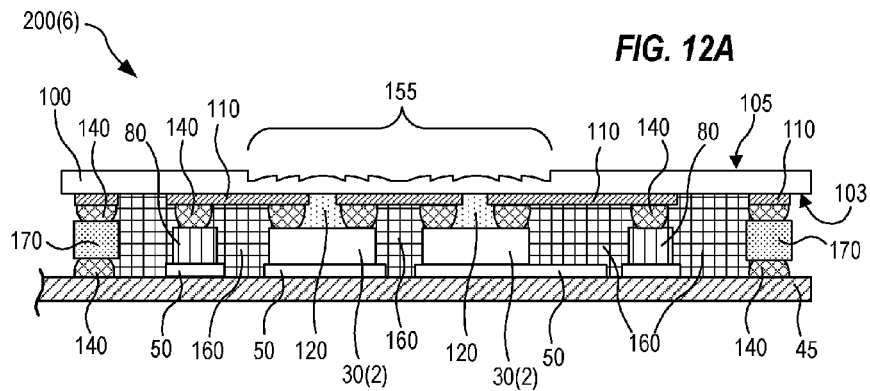
FIG. 12A shows a cross-sectional view of a PCB assembly, in accord with an embodiment.
Figure 12B:
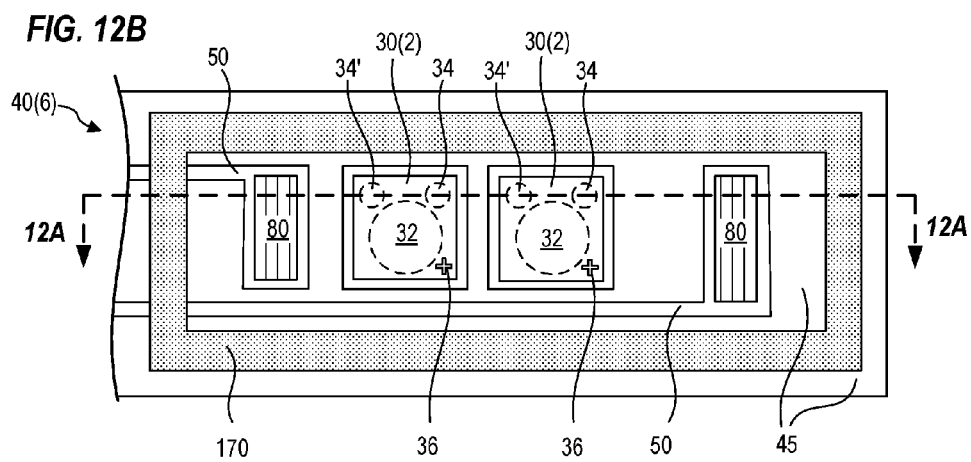
FIG. 12B shows a PCB with LED chips, standoffs and insulating dam attached thereto, ready for attachment to a cover plate subassembly to form the PCB assembly of FIG. 12A.
Figure 12C:
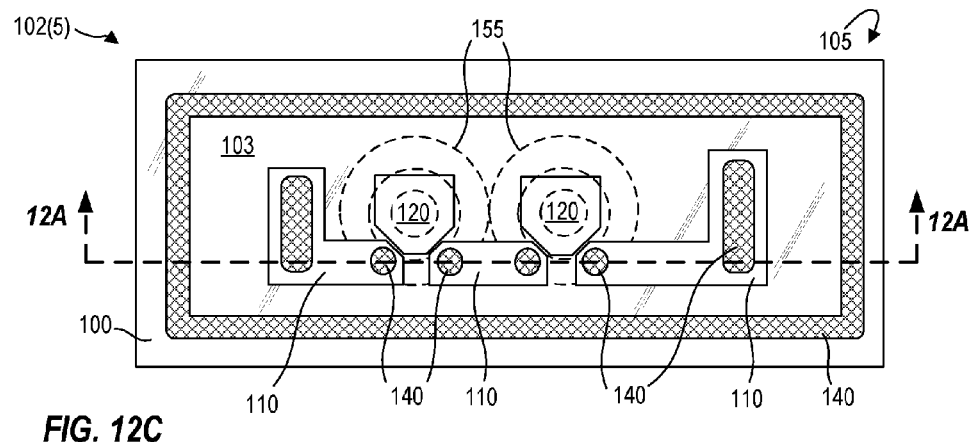
FIG. 12C shows cover plate subassembly with multiple instances of conductors, phosphor gel and conductive epoxy ready for alignment to, and coupling with, the PCB of FIG. 12B to form the PCB assembly of FIG. 12A.

FIG. 12A shows a cross-sectional view of a PCB assembly 200(6). PCB assembly 200(6) has two LED chips 30(2) that each couple to a PCB 40(6) (FIG. 12B) and, using two instances of conductive epoxy per LED chip 30(2), to a cover plate subassembly 102(5) (FIG. 12C). PCB assembly 200(6) also includes an insulating dam 170 for containing fill material 160. Dam 170 is shown in FIG. 12A as attached to PCB 40(6) and to cover plate assembly 102(5) using epoxy 140; in other embodiments dam 170 may be formed of an electrically conductive material and may attach to a PCB and/or a cover plate using solder. FIG. 12A also illustrates optics 155 in the form of a Fresnel lens formed into top surface 105 of cover plate 100. FIG. 12B shows PCB 40(6) with LED chips 30(2), standoffs 80 and insulating dam 170 attached thereto. FIG. 12C shows cover plate subassembly 102(5) with multiple instances of conductors 110, phosphor gel 120 and conductive epoxy 140 ready for alignment to, and coupling with, PCB 40(6) (FIG. 12B). FIG. 12C shows cover plate subassembly 102(5) from the perspective of facing bottom surface 103 of cover plate 100; optics 155 are therefore shown in dashed lines where visible through transparent cover plate 100 and phosphor gel 120 in top surface 105 (see FIG. 12A).

Sight lines 12A-12A in each of FIG. 12B and FIG. 12C indicate the plane at which the cross-sectional view of FIG. 12A is taken.

Figure 13:
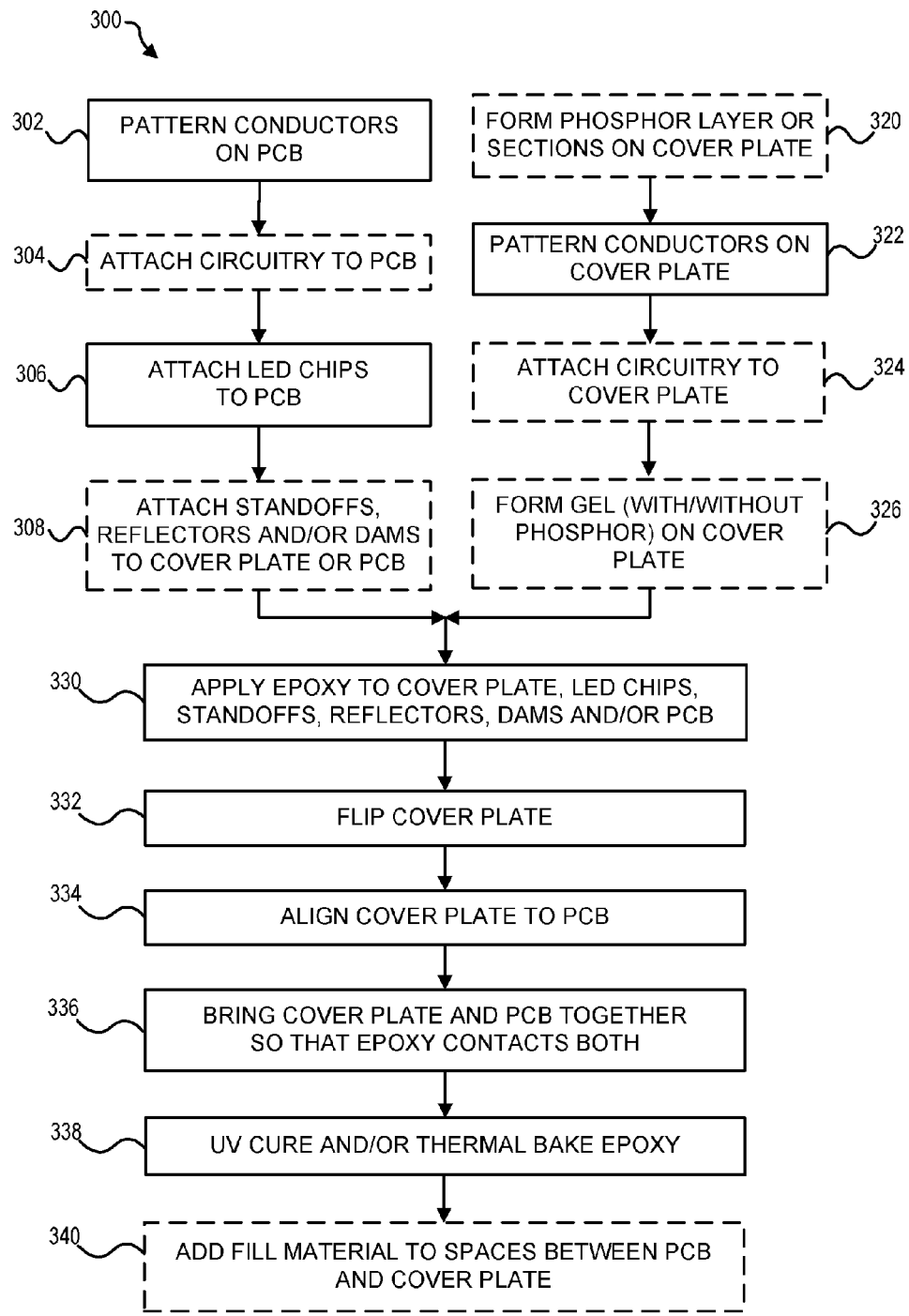
FIG. 13 is a flowchart showing steps of a method of assembling a PCB assembly with LED chips, in accord with an embodiment.

FIG. 13 is a flowchart showing steps of one exemplary method 300 of assembling a PCB assembly with LED chips. Method 300 may, for example, be utilized to assemble PCB assembly 200. Steps 302 through 308 assemble a PCB portion of the PCB assembly, while steps 320 through 326 assemble a cover plate subassembly independently of the PCB portion. Steps 330 through 340 join the cover plate portion to the PCB portion to form the completed PCB assembly.

Step 302 patterns conductors on a PCB (e.g., patterns conductors 50 on PCB 40) using known methods of PCB fabrication. An optional step 304, shown in a dashed box, attaches circuitry (e.g., circuit components 60) to the PCB, either by soldering or by attaching the circuitry to the PCB using conductive epoxy.

Step 304 is not applicable for products where circuit components are not needed or are not implemented on the same PCB as the LED chips (e.g., when PCB 40 includes only LED chips, and circuit functionality is implemented elsewhere). Step 306 attaches LED chips (e.g., LED chips 30) to the PCB. An optional step 308 attaches one or more standoffs (e.g., standoff 80), reflectors (e.g., reflector 150) and/or dams (e.g., dam 170) to the PCB. Steps 306 and 308 may utilize solder and/or conductive epoxy; when epoxy is used, the corresponding step may include a thermal bake or UV cure to harden the epoxy.

An optional step 320, shown in a dashed box, forms a phosphor layer (e.g., layer 122) or phosphor sections (e.g., phosphor layers 130) on a cover plate (e.g., on cover plate 100). Step 322 patterns conductors on the cover plate (e.g., patterns conductors 110). An optional step 324 attaches circuitry to the cover plate. An optional step 326 forms a conformal index matching gel (e.g., gel 120, 120') on the cover plate. Step 326 may be omitted (a) for cost savings, (b) when the LED chips being assembled include index matching gel and/or phosphor coating applied in wafer form, and/or (c) when fill material is to be utilized for purposes similar to those of the index matching gel.

Step 330 applies conductive epoxy to conductors, LED chips, reflectors, dams and/or standoffs on one or both of (a) the PCB prepared as in steps 302 through 308, and (b) the cover plate subassembly prepared as in steps 320 through 326. Step 332 flips over the cover plate subassembly such that the conductive epoxy applied in step 330 faces the corresponding locations on the other of the cover plate portion and the PCB. Step 334 aligns the cover plate subassembly with the PCB. Step 336 moves the cover plate subassembly and the PCB portion together such that the epoxy couples the appropriate locations on the PCB and its components, with the appropriate locations on the cover plate subassembly. It is appreciated that steps 334 and 336 may be iterated, combined, or performed in a different order than that shown in FIG. 9. For example, a crude alignment may be performed first, followed by a crude approach of the cover plate subassembly to the PCB (at which point the conductive epoxy may or may not be in contact with both the cover plate subassembly and the PCB), followed by a fine alignment, followed by bringing the cover plate portion and the PCB portion together to a final distance from one another. Step 338 utilizes UV light or a thermal bake to cure the conductive epoxy applied in step 330, to complete the assembly of the PCB assembly. An optional step 340 applies fill material to spaces between the PCB and the cover plate, as described in connection with FIG. 9A.

Figure 14A:
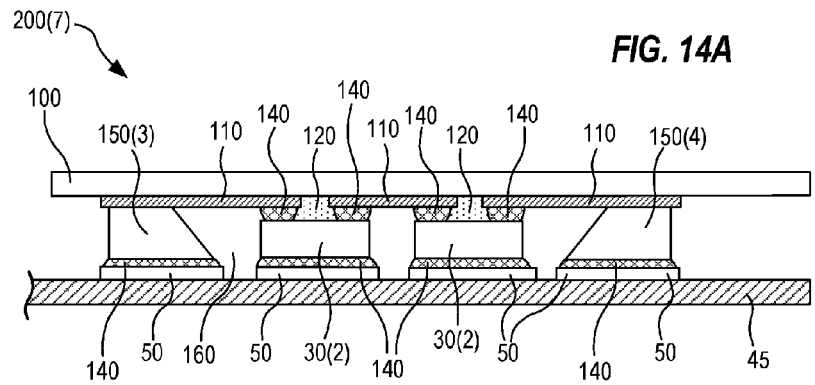
FIG. 14A shows a cross-sectional view of a PCB assembly that includes two LED chips that each couple to a PCB and to a cover plate subassembly, in accord with an embodiment.
Figure 14B:
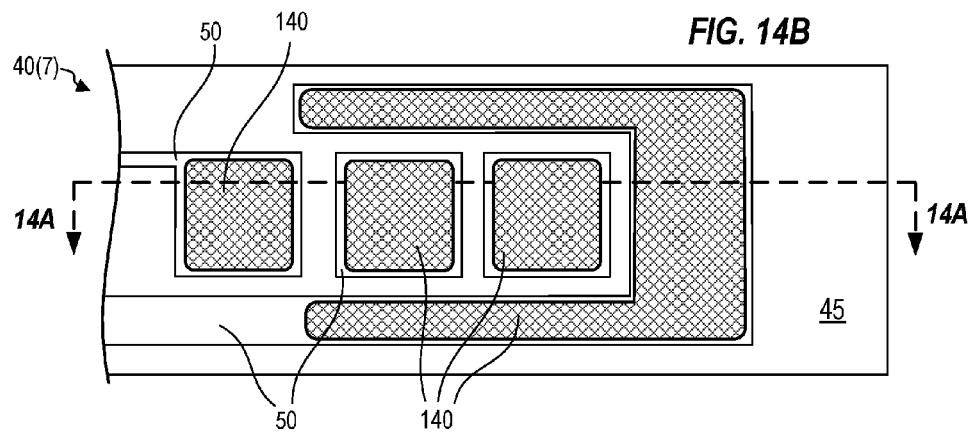
FIG. 14B shows a PCB with conductive epoxy applied in locations facing LED chips and reflectors of a cover plate subassembly, during assembly of the PCB assembly of FIG. 14A.
Figure 14C:
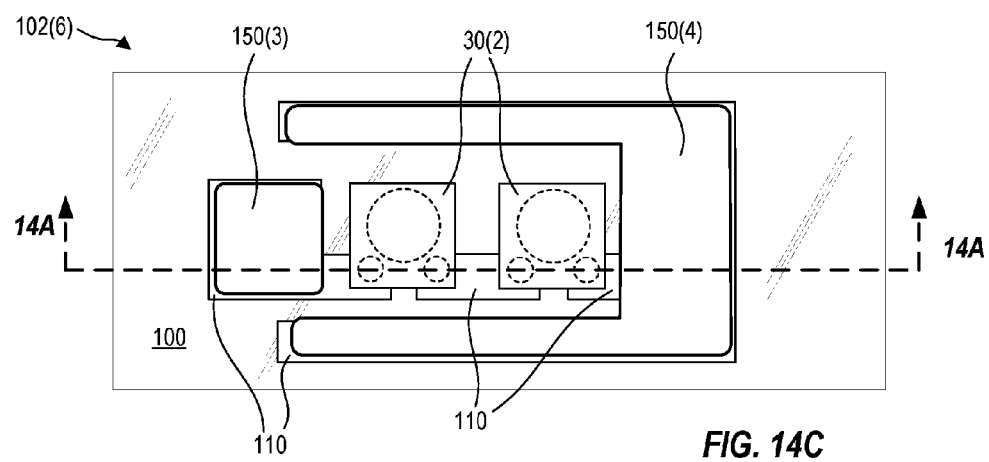
FIG. 14C shows a cover plate subassembly with multiple instances of conductors, LED chips and reflectors attached thereto, ready for attachment to the PCB of FIG. 14B to form the PCB assembly of FIG. 14A.

FIG. 14A shows a cross-sectional view of a PCB assembly 200(7) that includes two LED chips 30(2) that each couple to a PCB 40(7) (see FIG. 14B) and to a cover plate subassembly 102(6) (see FIG. 14C). PCB assembly 200(7) is manufactured by attaching LED chips 30(2) to cover plate subassembly 102(6) before cover plate assembly 102(6) attaches to PCB assembly 200(7), as described below. PCB assembly 200(7) also includes reflectors 150(3) and 150(4) that each have a height that is sufficient for the reflectors to function as standoffs, that is, to set a distance between PCB 40(7) and a cover plate 100 (see FIG. 14C). FIG. 14B shows PCB 40(7) with conductors 50 and conductive epoxy 140 applied in locations facing LED chips 30(2) and reflectors 150(3) and 150(4) as shown in FIG. 14C. FIG. 14C shows cover plate subassembly 102(6) with multiple instances of conductors 110 fabricated thereon, and with LED chips 30(2) and reflectors 150(3) and 150(4) attached thereto. Dashed lines within LED chips 30(2) show positions of light emitting areas and frontside contacts that are on the underside of LED chips 30(2), that is, facing cover plate 100. Sight lines 14A-14A in each of FIG. 14B and FIG. 14C indicate the plane at which the cross-sectional view of FIG. 14A is taken.

Figure 15:
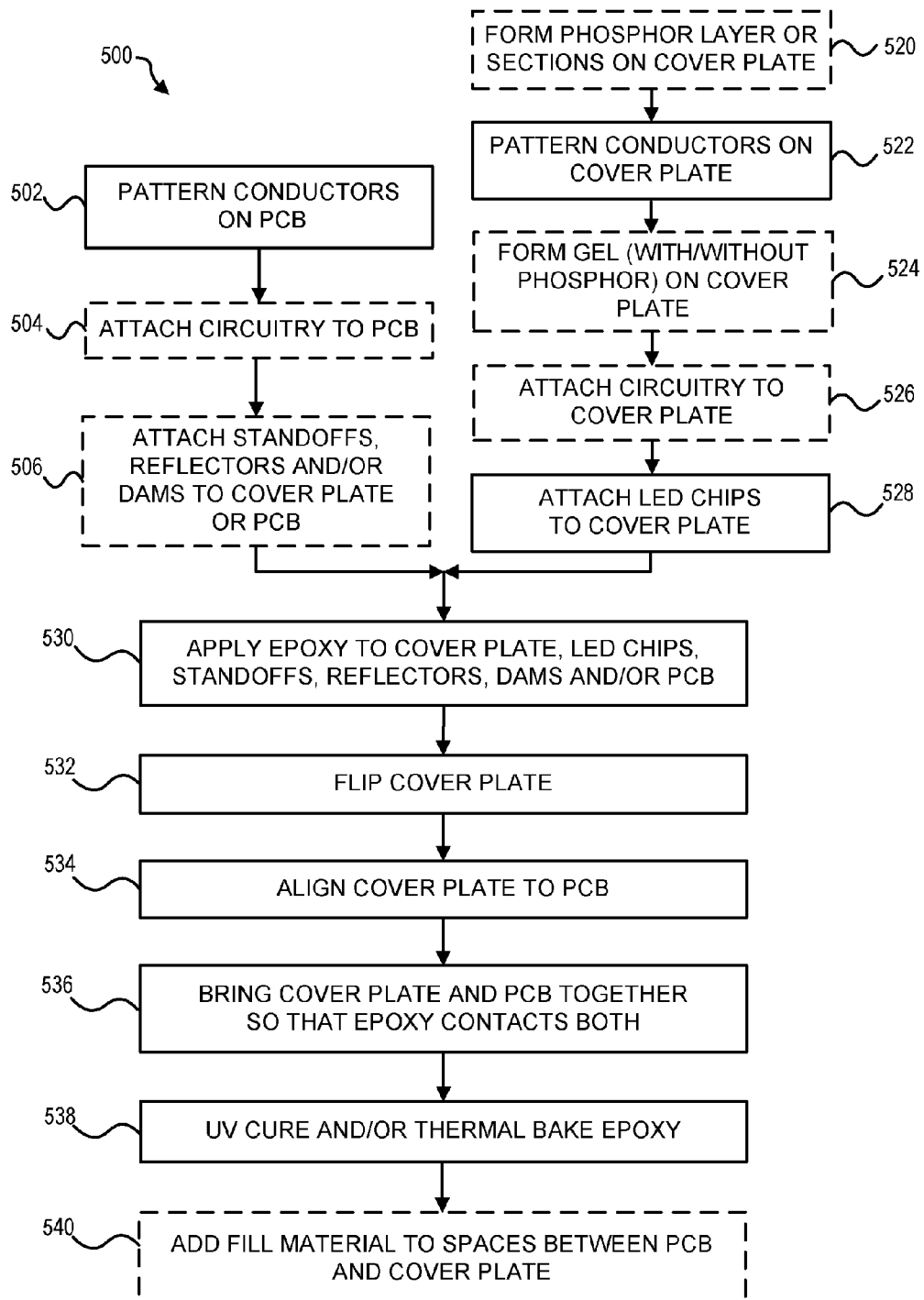
FIG. 15 is a flowchart showing steps of a method 500 of assembling a PCB assembly with LED chips, in accord with an embodiment.

FIG. 15 is a flowchart showing steps of one exemplary method 500 of assembling a PCB assembly with LED chips. Method 500 may, for example, be utilized to assemble PCB assembly 200. Steps 502 through 506 assemble a PCB portion of the PCB assembly, while steps 520 through 528 assemble a cover plate subassembly independently of the PCB portion. Steps 530 through 540 join the cover plate portion to the PCB portion to form the completed PCB assembly.

Step 502 patterns conductors on a PCB (e.g., patterns conductors 50 on PCB 40) using known methods of PCB fabrication. An optional step 504, shown in a dashed box, attaches circuitry (e.g., circuit components 60) to the PCB, either by soldering or by attaching the circuitry to the PCB using conductive epoxy. Step 504 is not applicable for products where circuit components are not needed or are not implemented on the same PCB as the LED chips (e.g., when PCB 40 includes only LED chips, and circuit functionality is implemented elsewhere). Optional step 506 attaches one or more standoffs (e.g., standoff 80), reflectors (e.g., reflector 150) and/or dams (e.g., dam 170) to the PCB. Step 506 may utilize solder and/or conductive epoxy; when epoxy is used, the corresponding step may include a thermal bake or UV cure to harden the epoxy.

An optional step 520, shown in a dashed box, forms a phosphor layer (e.g., layer 122) or phosphor sections (e.g., phosphor layers 130) on a cover plate (e.g., on cover plate 100). Step 522 patterns conductors on the cover plate (e.g., patterns conductors 110). An optional step 524 forms a conformal index matching gel (e.g., gel 120, 120') on the cover plate. Step 524 may be omitted (a) for cost savings, (b) when the LED chips being assembled include index matching gel and/or phosphor coating applied in wafer form, and/or (c) when fill material is to be utilized for purposes similar to those of the index matching gel. An optional step 526 attaches circuitry to the cover plate. Step 528 attaches the LED chips to the cover plate.

Step 530 applies conductive epoxy to one or the other of conductors, LED chips, reflectors, dams and/or standoffs on the PCB prepared as in steps 502 through 508, and/or the cover plate subassembly prepared as in steps 520 through 524. Step 532 flips over the cover plate subassembly such that the conductive epoxy applied in step 530 faces the corresponding locations on the other of the cover plate portion and the PCB. Step 534 aligns the cover plate subassembly with the PCB. Step 536 moves the cover plate subassembly and the PCB portion together such that the epoxy couples the appropriate locations on the PCB and its components, with the appropriate locations on the cover plate subassembly. It is appreciated that steps 534 and 536 may be iterated, combined or performed in a different order than that shown in FIG. 9. For example, a crude alignment may be performed first, followed by a crude approach of the cover plate subassembly to the PCB (at which point the conductive epoxy may or may not be in contact with both the cover plate subassembly and the PCB), followed by a fine alignment, followed by bringing the cover plate portion and the PCB portion together to a final distance from one another. Step 538 utilizes UV light or a thermal bake to cure the conductive epoxy applied in step 530, to complete the assembly of the PCB assembly. An optional step 540 applies fill material to spaces between the PCB and the cover plate, as described in connection with FIG. 9A.

While the trend in the solid-state lighting industry is to employ large LED chips, small LED chips often have a much greater extraction efficiency of light because light emitted laterally within the chip has a greater chance of being emitted from the chip rather than interacting with the semiconductor material before emission can occur. However, total light output (lumen output) is reduced as the chip dimensions are reduced. Therefore, a large number of small LED chips may be used to compensate for the lower levels of light generated by each small LED chip.

Figure 16A:
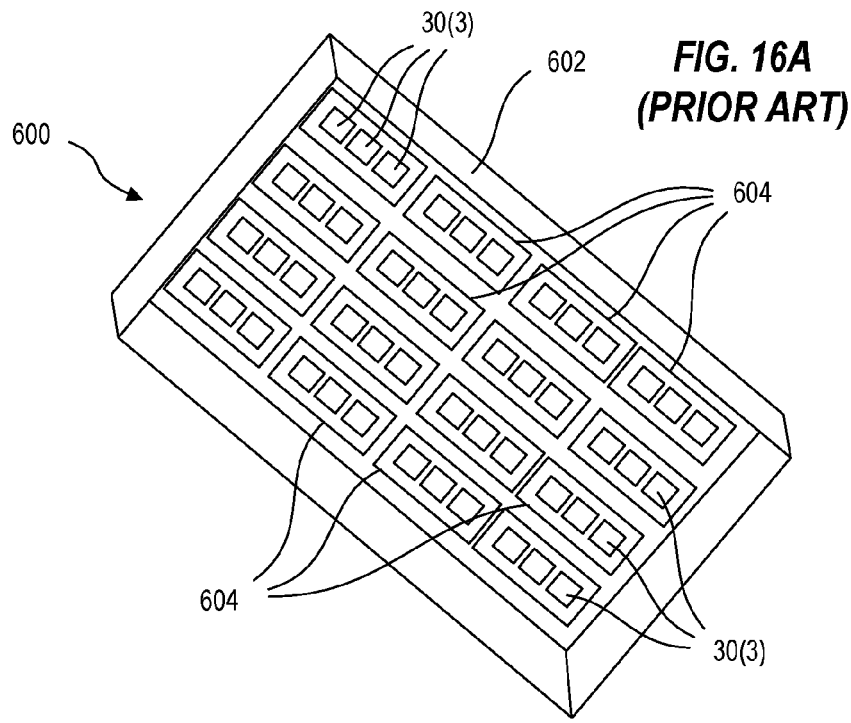
FIG. 16A illustrates a prior art LED-based lighting system.

FIG. 16A schematically shows a prior art LED lighting product 600. Lighting product 600 includes a mechanical fixture 602 in which are mounted LED light modules 604. Each light module 604, in turn, includes an array of three large LED chips 30(3).

Figure 16B:
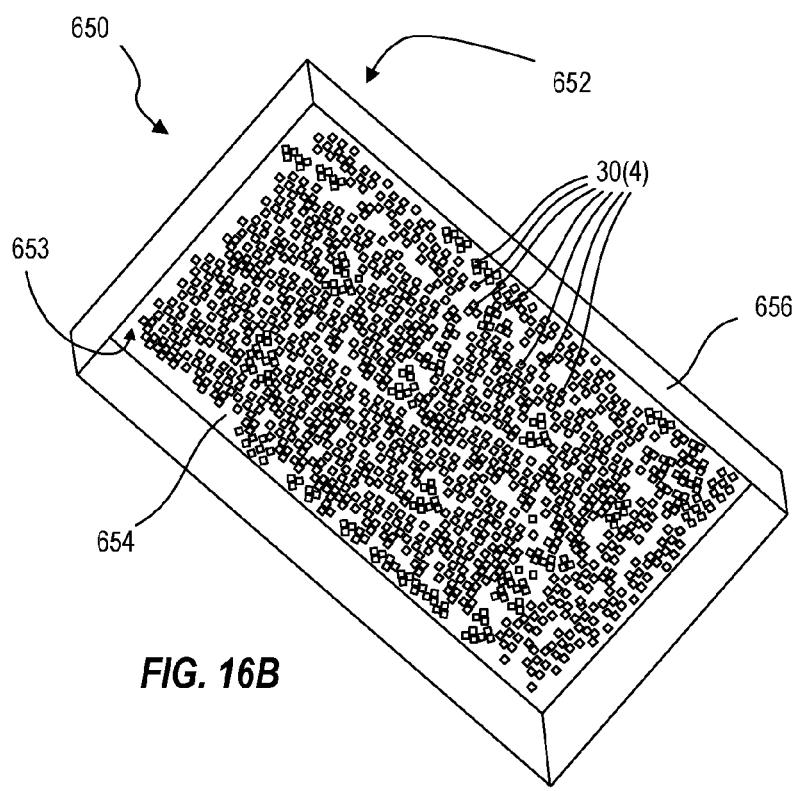
FIG. 16B illustrates an LED chip-based lighting product, in accord with an embodiment.

FIG. 16B shows an LED chip-based lighting product 650. Lighting product 650 includes a panel 654 within a frame 656. Lighting product 650 may be, for example, a troffer. Panel 654 may be made of (a) an electrically insulating material, or (b) an electrically conductive material coated with an insulating material; for example, panel 654 may be a painted metal panel. Many small LED chips 30(4) mount on a first surface 653 of panel 654. LED chips 30(4) are, for example, stochastically arranged on first surface 653 such that no lines, grids or other regular patterns are evident. LED chips 30(4) may range in size from 0.25 mm² to 4 mm² A second surface 652 of panel 654 counterfaces first surface 653; that is, surface 652 is on an opposite side of panel 654 from surface 653. At least part of second surface 652 is an external surface of lighting product 650. In certain embodiments, one or more of LED chips 30(4) are attached by wirebonds to conductors formed on first surface 653 (e.g., see FIG. 18). In certain embodiments, one or more of LED chips 30(4) may couple with a cover plate assembly as substantially described above and illustrated in FIGS. 11A-11C. The stochastic arrangement of LED chips, use of small chips, and their use on a panel that forms an external surface of lighting product 650 is advantageous from the perspective of a user for several reasons, including: (1) Human users often find regular patterns of visible objects such as light sources distracting, and such patterns can cast light in stripes or other distracting light patterns, whereas stochastic arrangements are less distracting and may cast light more evenly. (2) The smaller LED chips produce less light per chip, such that the individual point sources do not produce discomfort if viewed directly. (3) Smaller LED chips may be more efficient than larger LED chips at emitting all of the light produced, so that net energy efficiency is higher. (4) Heat dissipation from each LED chip 30(4) does not pass first to a PCB, then to other structures of lighting product 650; instead, the backside of each chip 30(4) forms a direct thermal interface, as defined below, through second surface 652 of panel 654 and then to ambient air. Lighting product 650 may include transmissive or translucent screens or diffusers as discussed below; such screens or diffusers are not shown in FIG. 16B for clarity of illustration.

Figure 17A:
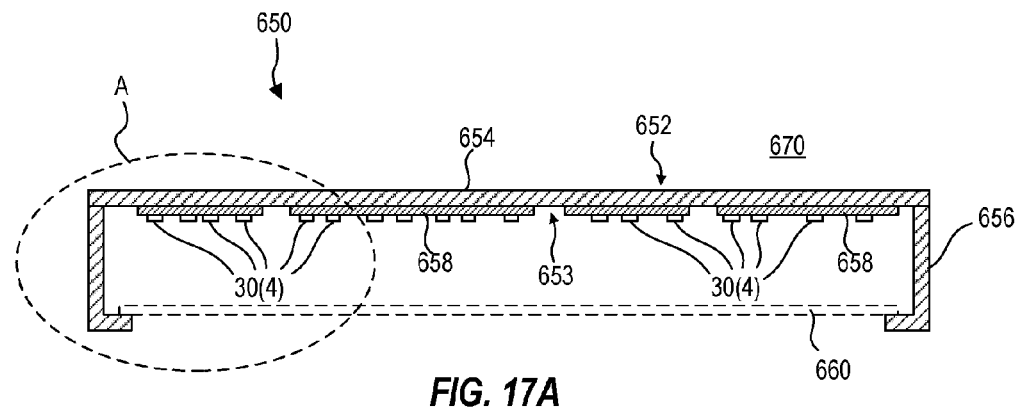
FIG. 17A is a cross-sectional view of a LED chip-based lighting product, in accord with an embodiment.

FIG. 17A is a cross-sectional view of LED chip-based lighting product 650. LED chips 30(4) are shown mounted with conductors 658 on first surface 653 of panel 654, so that one of the electrical contacts of each LED chip is through one of the conductors 658. In an alternative embodiment, LED chips 30(4) mount directly to first surface 653 of panel 654 and all electrical connections are made through the top side of each LED chip. A frame 656 attaches to panel 654 and holds an optional diffuser 660. Second surface 652 of panel 654, counterfacing first surface 653, is an external surface of lighting product 650 and is in thermal communication with ambient air 670. The term "ambient air" herein denotes air entirely outside a lighting product, and excludes air within enclosed cavities of the lighting product. In the embodiment of FIG. 17A, all of second side 652 forms an external surface of lighting product 650; however in other embodiments an external surface may be formed by only a portion of a second side of a panel. A region within LED chip-based lighting product 650 is denoted as A and is described in further detail below.

Figure 17B:
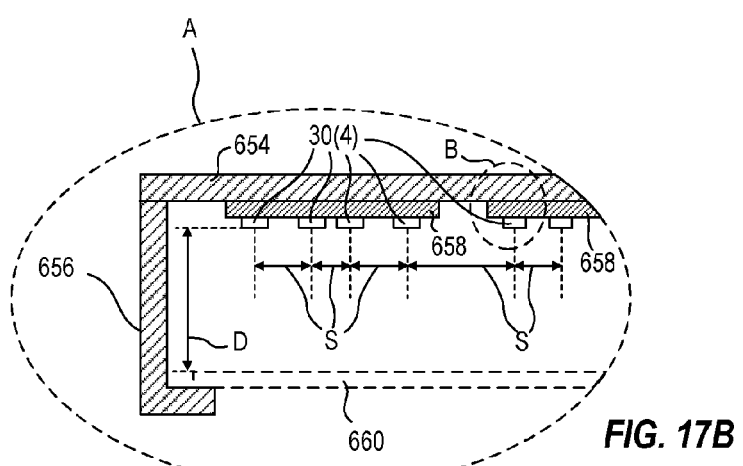
FIG. 17B is a detail view of a region denoted A within the LED chip-based lighting product of FIG. 17A.

FIG. 17B is a detail view of region A shown in FIG. 17A. Spacings between adjacent LED chips 30(4) are denoted as S. While the value of S varies among the various adjacent pairs of LED chips 30(4) in lighting product 650, an average value $S_{avg}$ of all such adjacent pairs of LED chips may be determined. Also in FIG. 17B, a standoff distance from surfaces of LED chips 30(4) to optional diffuser 660 is denoted as D. When D is greater than or equal to about two times $S_{avg}$, light from adjacent LED chips 30(4) blends together on diffuser 660 such that an overall light distribution from lighting product 650 appears to a user as a somewhat homogeneous lighted area, instead of a collection of individual points or spots of light. The appearance of a lighted area instead of points of light may be preferable and less distracting to a user of lighting product 650. A region within region A is denoted as B and is described in further detail below.

Figure 17C:
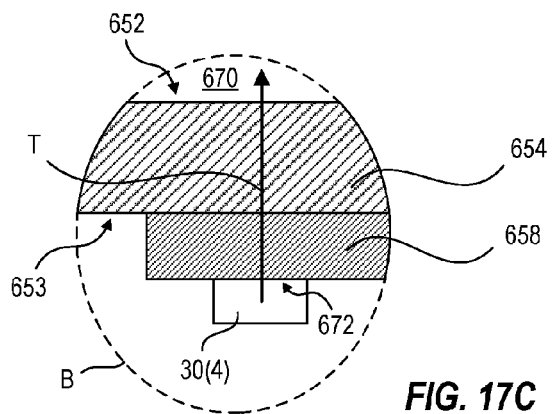
FIG. 17C is a detail view of a region denoted B within region A of the LED chip-based lighting product of FIG. 17A.

FIG. 17C is a detail view of region B shown in FIG. 17B and shows LED chip 30(4) mounted with conductor 658 formed on first surface 653 of panel 654. A backside surface of LED chip 30(4) that faces conductor 658 is shown as mounting surface 672. An arrow T illustrates a direct thermal interface from LED chip 30(4) that extends perpendicularly through mounting surface 672, conductor 658 and panel 654 to ambient air 670. The term "direct thermal interface" herein, when used in connection with an LED chip, denotes an arrangement of at most one conductor, one panel and intervening mounting materials (e.g., solder, epoxy or adhesive) that extends perpendicularly from a backside of the LED chip to ambient air. A direct thermal interface thus excludes arrangements that require heat transfer in one or more lateral directions (any direction that is not perpendicular to an LED chip's mounting surface, e.g., surface 672) to reach ambient air, and arrangements that transfer heat from an LED to enclosed cavities. Used in connection with a packaged LED, the term "direct thermal interface" denotes a similar arrangement of at most one conductor, one panel and intervening mounting materials (e.g., solder, epoxy or adhesive) that extends perpendicularly away from a light emitting side of the packaged LED to ambient air.

Figure 18:
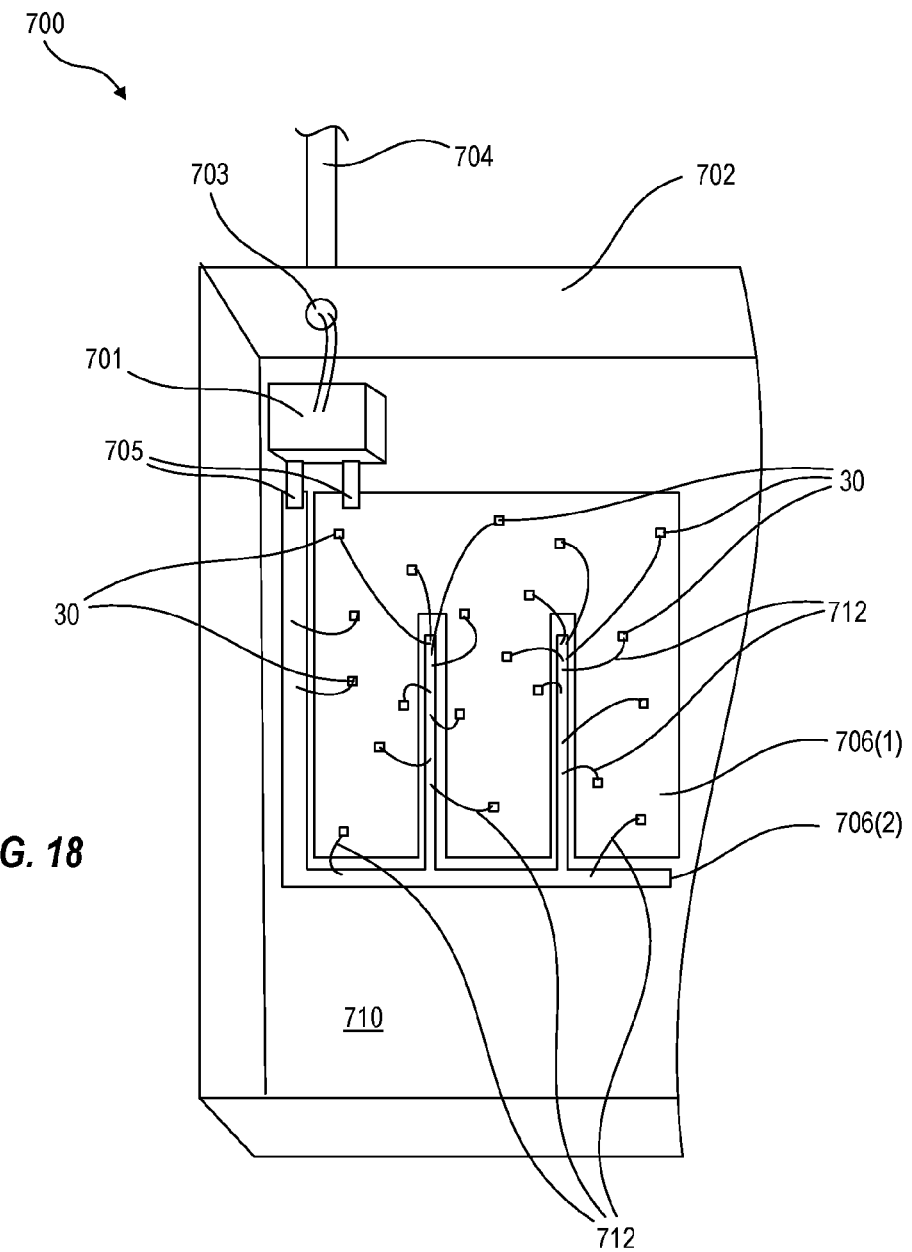
FIG. 18 is a detailed illustration of a portion of an LED chip-based lighting product, in accord with an embodiment.

FIG. 18 shows a portion of an embodiment of an LED chip-based lighting product 700. Lighting product 700 includes a connection 704 to an external power source. Connection 704 may be, for example, a power cord or wiring enclosed within a conduit. The external power source (not shown) connects, through connection 704, to optional power conversion electronics 701 through an aperture 703 in a light fixture 702. Power conversion electronics 701 may include power conditioning and control components, for example (a) to convert AC power to DC power, and (b) to regulate voltage and/or current of the DC power as needed for LEDs (e.g., to convert high input voltage to a maximum voltage usable with LEDs, and/or to vary light output of the LEDs for dimming); steps (a) and (b) may be done in any order or repeatedly. Conductors 706 are formed on an upper panel 710 of light fixture 702 by conventional means such as silk screening, inkjet printing, photolithography, electroplating and/or other methods known in the art. LED chips 30 mount to one or more conductors 706, typically through the use of automated pick and place equipment.

FIG. 18 shows LED chips 30 connected to power conductor 706(2) via wirebonds 712, but other means of establishing connections from LED chips 30 to conductor(s) may be used. Also, it is appreciated that if LED chips 30 are fabricated with two backside electrical connections (e.g., on the opposite side of the chips from their emitting surfaces), that connections may be made to conductors 706 with the electrical connections facing downwardly (e.g., facing panel 710) and the emitting surface facing upwardly (e.g., emitting outwards from panel 710). (Not all LEDs 30 or their associated wirebonds 712 are labeled in FIG. 17, for clarity of illustration). Conductors 706 are shown in FIG. 17 as one large ground conductor 706(1) (e.g., a ground connection for the LED chips) interdigitated with one power conductor 706(2) (e.g., a power connection), but it is appreciated that conductors 706 may be routed in any convenient fashion utilizing automatic routing tools as are known in the art of PCB design. Power conversion electronics 701 supply electrical power to conductors 706 via electrical traces 705 that may be, for example, leads extending from power conversion electronics 701 that are soldered to conductors 706. LED chips 30 are mounted onto conductors 706 using conductive epoxy, solder, or other known materials and methods for attaching semiconductor chips to substrates.

LED chips 30 may, optionally, be coated with one or more materials that may include protective substance(s) for protection from contaminants and/or phosphors for downconverting wavelength of a portion of the light emitted by each LED to a longer wavelength (e.g., to create "white" light from LED chips emitting mostly blue light). Alternatively, one or more cover plates may be applied to individual LED chips, groups of LED chips or an entire fixture. Although the surface area of light fixture 702 is inherently conducive to heat dissipation, extra heat sinks such as fins (not shown) may be added to light fixture 702 to further promote heat dissipation.

Figure 19:
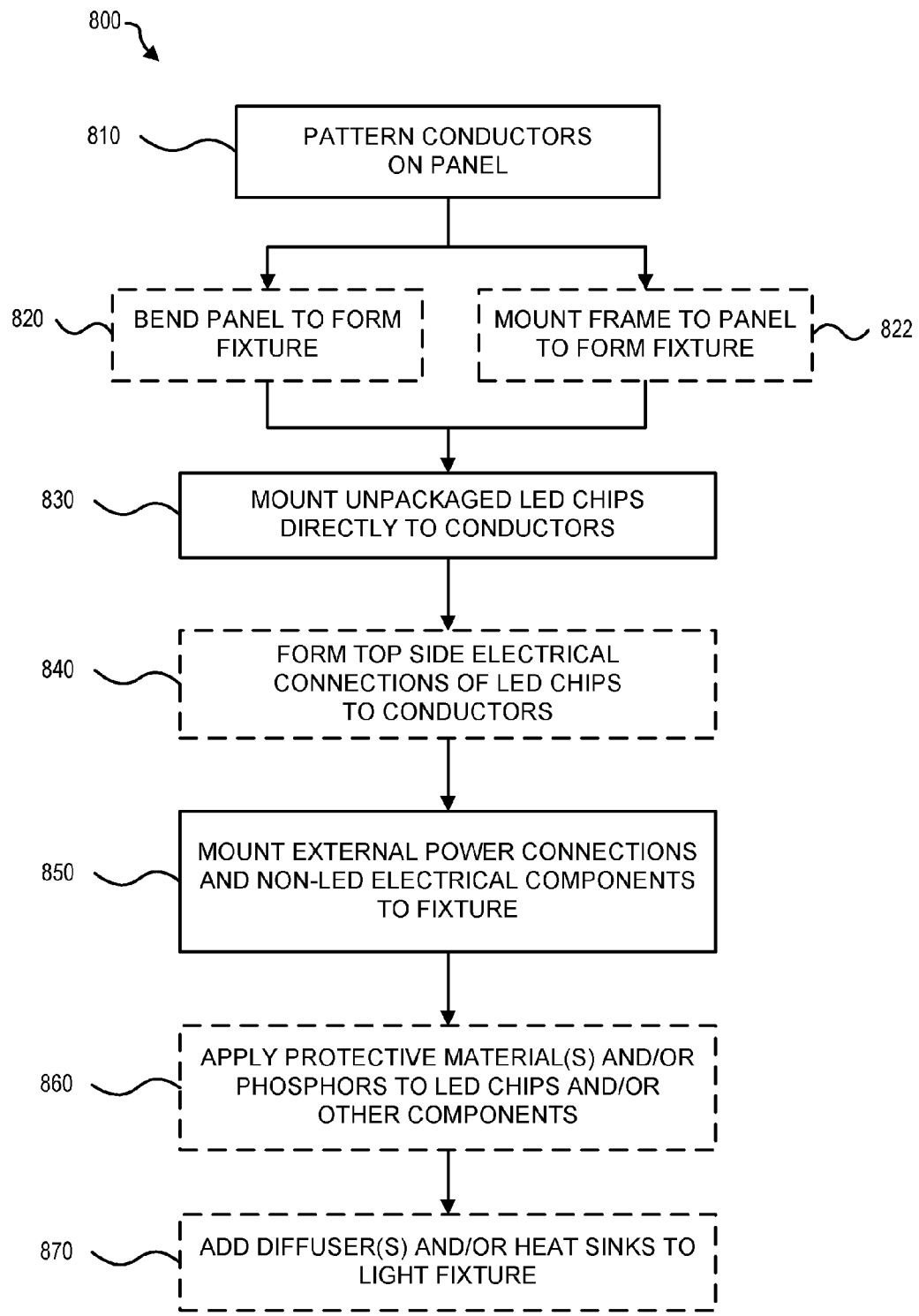
FIG. 19 is a flowchart showing steps of a method for building an LED chip-based lighting product, in accord with an embodiment.

LED chip-based lighting products may be assembled in several ways at a fixture level, that is, in terms of integrating a substrate or panel to which the LED chips are attached, to support structure of the lighting product. FIG. 19 shows one exemplary flowchart of a method 800 for assembling LED chip based lighting products. Method 800 describes assembly of a lighting product exemplified as based on a mechanical fixture for a troffer type lighting product; however it is appreciated by those skilled in the art that the techniques described therein may be adapted to assembly of other lighting products. It is also appreciated that certain steps of method 800 may be omitted or performed in an order different than that shown in FIG. 18.

Step 810 patterns conductors on a panel that will eventually form a top inside surface of the lighting product. In this way, method 800 takes advantage of the fact that the step of patterning the conductors (e.g., screen printing, or photolithography and etching of conductive layers) may be more easily performed on a flat panel, than on a panel that is not flat. Step 810 may implement a stochastic layout for a large number of LEDS on the panel, as discussed previously.

Method 800 alternatively includes step 820 or step 822, which are shown as following step 810, but it is appreciated that step 820 or 822 may be performed later in method 800, such as after any of steps 830, 840 and 850, discussed below. Step 820 bends the panel to form the mechanical fixture, and step 822 mounts the panel to a frame to form the mechanical fixture. In one embodiment, step 822 involves mounting (e.g., screwing or bolting) a frame to edges of the panel. Alternatively, step 822 may place the panel with LED chips atop another panel and the two panels may be bonded together. In this case, one of the panels is preferably ductile or compliant such that intimate thermal contact is provided between the panels when dust or other contamination blocks direct contact between the two panels at one location. Alternatively, a thermally conductive paste or adhesive may be utilized to join the two panels.

Step 830 mounts LED chips to the conductors. As previously discussed, step 830 may include picking and placing the LED chips from stretched tape or from die carriers, and may include affixing the LED chips to the conductors utilizing conductive epoxy, solder, or other known methods for attaching a chip to a conductor. An optional step 840 forms top side electrical connections of the LED chips to the lighting product. Step 840 is not needed when step 830 includes establishing all needed electrical connections of the LED chips through their bottom sides (e.g., when the LED chips have both P and N contacts on their bottom sides). Step 840 may include, for example, forming wirebond connections from bonding pads on top sides of the LED chips to the conductors formed on the panels in step 810. Step 840 may also be performed in conjunction with step 860 discussed below, when protective material in the form of a cover panel is affixed over the LEDs.

Step 850 mounts external electrical connections, and non-LED electrical components, to the mechanical fixture. At a minimum, step 850 establishes some means for transferring electrical power into the fixture; the electrical power may be controlled external to the fixture, or means for transferring raw power (e.g., 120 VAC power) may be established, along with power conditioning and control elements to convert the raw power into an appropriate power source for the LEDs. For example, an external power connection in the form of wires in a conduit may be brought through an aperture in one side of the fixture, the wires may connect to a PCB having power conditioning components thereon, and conditioned power for the LEDs may be transferred to the conductors by connections soldered between the PCB and the conductors.

Step 860 applies one or more materials, such as protective materials and/or phosphors, to the LED chips and/or to other components (e.g., the components mounted in step 850). In one example of step 860, transparent epoxy is applied over each LED chip so that when the epoxy cures, the LED chip is protected but can emit light through the epoxy. The epoxy may include one or more phosphors for downconverting a portion of the light from the LEDs to longer wavelengths. Another example of step 860 is mounting one or more cover plates or lenses over one or more LED chips at a time, as described in conjunction with FIGS. 8A through 14C. A single cover plate may be applied over the entire panel. When one or more cover plates are utilized, electrical connections may be formed simultaneously and fill materials, optionally including a phosphor, may be applied, as also described in conjunction with FIGS. 8A through 14C. It is appreciated that application of a phosphor alone may take place for example between steps 830 and 840; that is, the phosphor may be applied to mounted LED chips before wirebonding occurs, so as to minimize risk of damage to wirebonds by applying the phosphor later.

An optional step 870 adds diffusers and/or heat sinks to the lighting product. Diffusers serve to further spread out light from the individual LED chips to reduce glare, and may be transparent, translucent or grate type elements. Grate type elements serve to reduce cut-off angle of a light fixture, which is an angle from a user to a light fixture where the light emitting elements themselves are no longer visible to the user. Human users of lighting products often prefer high cut-off angles, that is, the users find it preferable not to be subjected to glare of light sources more or less in their line of sight, but rather to have such sources at a high angle where human eyebrows form a natural glare shield. Grate type elements may be particularly advantageous in LED chip-based lighting products, by serving the dual functions of increasing cut-off angle and as additional heat sinking elements. Another type of diffuser that may be particularly advantageous is a diffuser that forms upwardly pointed shapes (e.g., pointed towards the LED chips), as each such shape will tend to split light incident upon it into a set of rays at differing angles. In so doing, from a user's standpoint, the shapes divide each point source into a distributed set of point sources, thus effectively splitting the light sources into multiple, fainter light sources that will be less distracting than the original, brighter sources. Transparent and translucent diffusers can also include phosphors or pigments for adjusting the spectral output of the lighting product.

Heat sinks may also be applied in step 870—typically to the top side of the panel (opposite the side where the LEDs are mounted)—to improve heat transfer away from the lighting product. The product may also be ventilated to encourage convective flow for heat removal. This runs counter to the prevailing practice in design of fluorescent fixtures, in which heat is often intentionally concentrated by providing a closed cabinet, since fluorescent ballasts and tubes are often more efficient at high temperatures.

In addition to a more evenly distributed light pattern, stochastic distribution of LED chips in an LED chip-based lighting product results in even and efficient thermal dissipation. Conventional modular arrays may localize heat buildup to a location where modules attach, creating areas of localized high temperature that may require large, area-specific heat sinks. By directly integrating unpackaged LED chips into a light fixture to form direct thermal interfaces, large heat sinks may be eliminated. In embodiments of LED chip-based lighting products, the light fixture itself is used as the heat sink due to the direct contact of the LED chips with the large surface area of the fixture. However, should increased heat dissipation be desired, additional heat sinks may be used to increase the surface area of the fixture.

Figure 20:
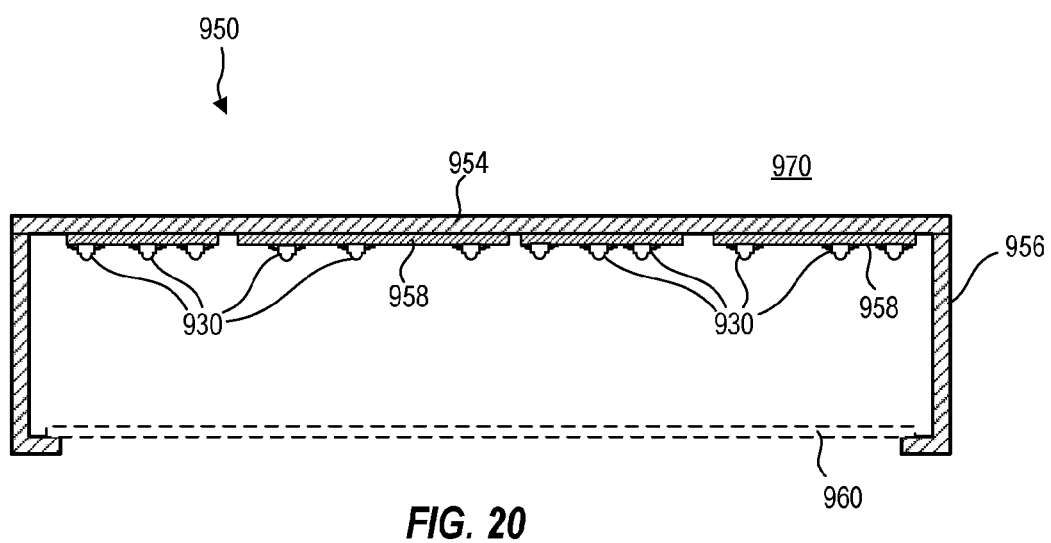
FIG. 20 shows a cross section of an LED-based lighting product, in accord with an embodiment.

Certain of the principles outlined above are useful with packaged LEDs as well as with LED chips, that is, certain but not all of the advantages and economies discussed will be obtained. FIG. 20 shows a cross section of an LED-based lighting product 950 that mounts packaged LEDs 930 directly onto conductors 958 patterned on a panel 954. Like panel 654 shown in FIGS. 16B and 17A through 17C, a first surface of panel 954 counterfaces a second surface of panel 954, and at least a part of the second side forms an exterior surface of lighting product 950. One or more of LEDs 930 is mounted to form a direct thermal interface to ambient air 970 through only conductors 958 and panel 954. LEDs 930 may be low power LEDs and are mounted in a widely distributed stochastic arrangement (e.g., like LED chips 30(4) on panel 654, FIG. 16B. A frame 956 attaches to panel 954 and holds an optional diffuser 960 at a distance from LEDs 930 at least twice an average spacing between adjacent LEDs 930 on panel 954 (the distance and spacing are not labeled in FIG. 20 but may be determined in the same way as the distance and spacing illustrated for LED chips in FIG. 17B). By directly mounting packaged one or more LEDs on a panel of which at least a part forms an exterior surface, lighting product 950 streamlines thermal dissipation and lowers manufacturing cost as compared with an approach that first mounts packaged LEDs on a PCB or other module, then mounts the module in a lighting product.

EXAMPLE 1

In one embodiment, a common 4'×2' troffer fixture provides 8 square feet of surface area that is used as a heat sink. The fixture is constructed of aluminum which results in a 4× increase of thermal conductivity compared to steel. Electrical connections to the LED chips are patterned onto the light fixture by known screen printing, inkjet technology or other means. Automated pick and place equipment places the LED chips in the correct positions, and wire bond equipment is used to connect the electrical traces. Five hundred 50 micron LED chips are stochastically distributed as a widely distributed stochastic arrangement over the 8 square feet of the aluminum fixture. Each 50 micron LED chip delivers a lumen output of 10 lumens. Thus the stochastic array of 500 LED chips produces a 5000 lumen output. Each LED chip is driven at around 3.4 V in the 30 mA to 50 mA range, resulting in a power distribution of approximately 6 to 10 W/ft², and the resulting heat is efficiently dissipated through a direct thermal interface from each LED chip to ambient air. Light distribution is maximized through the use of high efficiency first surface diffuse reflectors with optical cavity structures to both minimize glare and optimize light distribution. A temperature increase (LED to ambient air) generated is between about 20° F. to about 60° F. depending upon the exact configuration of the troffer and the stochastic array. Modification of the troffer fixture may includes additional thermal fins or heat sinks, should additional cooling be desired.

In addition to more even distribution of light, stochastic arrays of small LED chips may result in greater overall energy efficiency. Ohmic losses within each LED converts part of the power used to drive the LED into heat. Equations that help illustrate this include:

$$V = I \cdot R \text{ ("Ohm's law")}, \quad (\text{Eq. 1})$$

where V=voltage, R=resistance and I=current, which can be restated as:

$$P = I^2 \cdot R \quad (\text{Eq. 2})$$

where P=V·I=power loss through ohmic resistance; and $$R(\text{spreading resistance}) = l \cdot A \cdot \rho \quad (\text{Eq. 3})$$

where l is the path length, A is cross-sectional area of an LED, and ρ is the bulk resistivity of the LED material (resistance per unit volume).

A larger LED chip has a longer path length l, which leads to higher resistance (Eq. 3) and thus higher ohmic power loss for a given current I (Eq. 2). Thus, if an LED chip size is reduced, power loss is reduced resulting in an improved overall efficiency of the system.

By directly mounting and integrating LED chips into light fixtures, manufacturing costs are greatly reduced by eliminating packaging such as metal core boards that are most often used to support the packaged LEDs. Not only does eliminating the module level PCBA reduce cost, thermal transfers between the LED chips and their packages, LED engine PCBAs, and structural elements and/or heat sinks to ambient air are minimized or eliminated.

Directly mounting the LEDs in the fixture eliminates many cost components, flattens the supply chain, and provides a viable path to achieving performance and cost goals. Furthermore, many additional benefits may be realized, such as improved thermal dissipation, lowered complexity and cost of the thermal dissipation system, lower demand on drive circuitry, improved drive circuitry reliability and greater overall system redundancy and reliability.

The changes described above, and others, may be made in the chip-in-fixture methods and systems described herein without departing from the scope hereof. For example, although embodiments herein have been illustrated with drawings showing certain numbers of LED chips, it should be clear that any number of LED chips may be incorporated into an LED based lighting product and that such chips may be arranged in two dimensional arrays or in stochastic two dimensional layouts. The embodiments herein are not limited to specific types of electrical routing shown in the drawings; LED chips may for example be connected in series or in parallel, using any number of conductors on panels, PCBs or cover plates, to connect topside or backside contacts. Phosphor layers and types may be single or multiple (for example, to provide multiple fluorescence wavelengths for broad spectrum light) and phosphors may be admixed with epoxies, conformal gels, index matching gels, fill material or cover plate materials. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. LED chip-based lighting product, comprising:
   PCB with at least one LED chip mounted directly thereon;
   cover plate coupled with the PCB such that light emitted by the LED chip transmits through the cover plate;
   fill material between the PCB and the cover plate; and
   an insulating dam that bounds a space between the cover plate and the PCB for containing the fill material therein.

2. LED chip-based lighting product of claim 1, further comprising phosphor layer between LED chips and the cover plate, such that light emitted by the LED chip causes fluorescence in the phosphor layer.

3. LED chip-based lighting product of claim 2, the phosphor layer being present only between the LED chip and the cover plate.

4. LED chip-based lighting product of claim 1, the cover plate comprising phosphor.

5. LED chip-based lighting product of claim 1, further comprising conformal gel between the LED chip and the cover plate.

6. LED chip-based lighting product of claim 5, the conformal gel having a refractive index that matched to the cover plate.

7. LED chip-based lighting product of claim 5, further comprising a phosphor admixed with the conformal gel, such that light emitted by the LED chip fluoresces the phosphor.

8. LED chip-based lighting product of claim 1, further comprising at least one standoff attached to the PCB and the cover plate, thereby defining a separation distance between the PCB and the cover plate.

9. LED chip-based lighting product of claim 8, the cover plate comprising at least one conductor, the standoff forming an electrical connection between the PCB and the conductor.

10. LED chip-based lighting product of claim 1, further comprising a reflector attached to at least one of the PCB and the cover plate, to reflect light emitted by the LED chip through the cover plate.

11. LED chip-based lighting product of claim 10, wherein the reflector couples to the PCB and the cover plate and defines a separation distance between the PCB and the cover plate.

12. LED chip-based lighting product of claim 10, the reflector forming an electrical connection between the PCB and the conductor.

13. LED chip-based lighting product of claim 1, the cover plate forming optics that modify light passing therethrough.

14. LED chip-based lighting product of claim 1, the LED chip comprising a plurality of LED chips.

15. LED chip-based lighting product of claim 14, the plurality of LED chips being arranged as an array on the PCB.

16. LED chip-based lighting product of claim 14, the plurality of LED chips being arranged stochastically on the PCB.

17. LED chip-based lighting product, comprising:
    a panel having an inner surface, and a counterfacing outer surface that forms at least part of an external surface of the lighting product;
    conductors patterned on the inner surface, and
    a plurality of unpackaged LED chips stochastically mounted to the conductors such that lines, grids or other regular patterns are not visually present.

18. LED chip-based lighting product of claim 17, the panel comprising an aluminum troffer, the plurality of unpackaged LED chips comprising 500 unpackaged LED chips.

19. LED chip-based lighting product of claim 17, at least some of the plurality of unpackaged LED chips having one or both of a protective material and a phosphor applied thereto.

20. LED chip-based lighting product of claim 17, further comprising a heat sink coupled with the outer surface.

* * * * *